(12) United States Patent
Ohoka et al.

(10) Patent No.: US 11,366,022 B2
(45) Date of Patent: Jun. 21, 2022

(54) SEMICONDUCTOR DEVICE HAVING A TEMPERATURE SENSOR

(71) Applicant: Panasonic Intellectual Property Management Co., Ltd., Osaka (JP)

(72) Inventors: Atsushi Ohoka, Kyoto (JP); Masahiko Niwayama, Kyoto (JP); Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 372 days.

(21) Appl. No.: 16/689,135

(22) Filed: Nov. 20, 2019

(65) Prior Publication Data

US 2020/0191661 A1 Jun. 18, 2020

(30) Foreign Application Priority Data

Dec. 17, 2018 (JP) .............................. JP2018-235770

(51) Int. Cl.
*G01K 7/01* (2006.01)
*H01L 27/02* (2006.01)
*H01L 29/16* (2006.01)

(52) U.S. Cl.
CPC .......... *G01K 7/015* (2013.01); *H01L 27/0211* (2013.01); *H01L 29/1608* (2013.01)

(58) Field of Classification Search
CPC ...... G01K 7/015; G01K 7/01; H01L 27/0211; H01L 29/1608; H01L 29/66068; H01L 29/7804; H01L 29/861; H01L 23/34
See application file for complete search history.

(56) References Cited

U.S. PATENT DOCUMENTS 10,141,411 B2 * 11/2018 Onogi ..................... H01L 23/34

FOREIGN PATENT DOCUMENTS

| JP | 2017-079324 | 4/2017 |
|----|-------------|--------|
| JP | 2017-174863 | 9/2017 |

* cited by examiner

*Primary Examiner* — Jung Kim
(74) *Attorney, Agent, or Firm* — McDermott Will & Emery LLP

(57) ABSTRACT

A semiconductor device is provided that includes a temperature sensing function that accurately senses a temperature. The semiconductor device includes a first semiconductor layer on a semiconductor substrate, and a temperature sensor. The temperature sensor includes: a sensing-body region of a second conductivity type that is disposed in the first semiconductor layer; a first region of a first conductivity type, and a second region of the first conductivity type that are arranged in the sensing-body region and are apart from each other; and a third region of the second conductivity type that is in the sensing-body region and is between the first region and the second region. A concentration of a first conductivity type impurity in the temperature-sensing conductive layer is higher than a concentration of a first conductivity type impurity in the drift region.

11 Claims, 15 Drawing Sheets

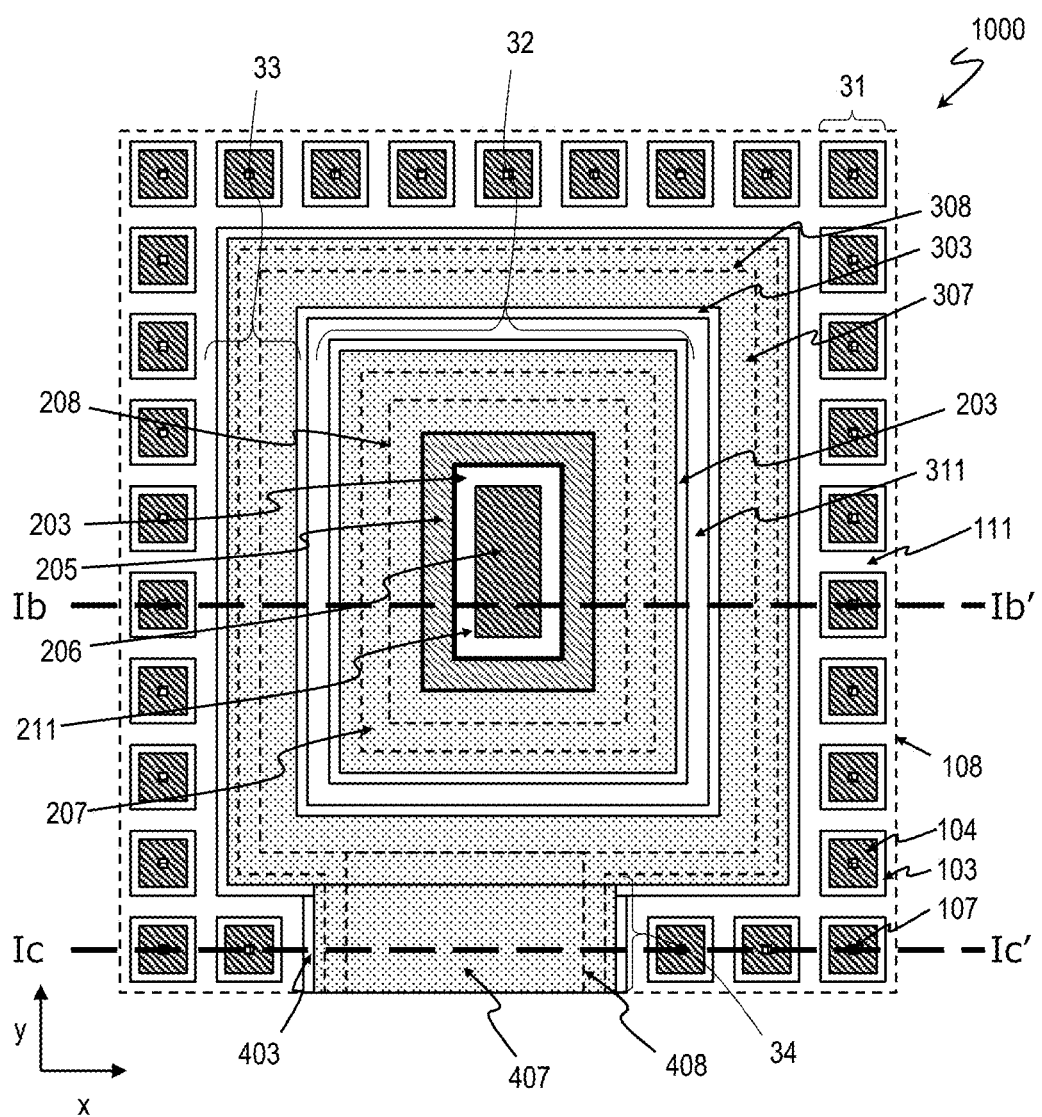

SEMICONDUCTOR DEVICE HAVING A TEMPERATURE SENSOR

BACKGROUND

1. Technical Field

The present disclosure relates to a semiconductor device.

2. Description of the Related Art

It is known that a temperature sensing function is provided for a semiconductor device, such as a metal-insulator-semiconductor field-effect transistor (MISFET), in order to prevent excessive heating that deteriorates reliability. For example, in a power semiconductor device used for a vehicle, an insulating film (field insulation film) is disposed on a semiconductor substrate, such as a silicon carbide semiconductor substrate, and a temperature sensor, such as a Zener diode, is disposed on the insulating film.

It is also proposed that a temperature sensor is disposed in a semiconductor substrate of a semiconductor device. For example, PTL 1 discloses a silicon carbide (SiC) semiconductor device that includes a pn diode that functions as a temperature sensor. The pn diode is disposed in a SiC substrate.

CITATION LIST

Patent Literature

PTL 1: Unexamined Japanese Patent Publication No. 2017-79324

SUMMARY

To allow a semiconductor device to operate efficiently, preferably, the semiconductor device is used around an upper limit of a temperature range within which the semiconductor device appropriately operates. For the purpose, temperature of the semiconductor device needs to be accurately monitored.

A present description discloses an exemplary embodiment that is not limiting but illustrative. The exemplary embodiment provides a semiconductor device that has a temperature sensing function that accurately senses its temperature.

An aspect of the present disclosure relates to a semiconductor device that includes a main area and a temperature sensing area. The semiconductor device includes a semiconductor substrate of a first conductivity type, and a first semiconductor layer that includes the main area and the temperature sensing area. The main area includes a plurality of unit cells. The temperature sensing area includes a temperature sensor.

The first semiconductor layer is on a main side of the semiconductor substrate.

The plurality of unit cells are arranged in the main area of the semiconductor substrate, and are connected with each other in parallel.

The temperature sensor is disposed in the temperature sensing area of the semiconductor substrate.

Each of the plurality of unit cells includes a main-body region of a second conductivity type, a source region of the first conductivity type, a drift region of the first conductivity type, a gate insulating film, a gate electrode, a source electrode, and a drain electrode. The main-body region is disposed in the first semiconductor layer, and is in contact with a surface of the first semiconductor layer. The source region is in the main-body region. The drift region is disposed in a region of the first semiconductor layer except the main-body region and the source region. The gate insulating film is disposed on the first semiconductor layer. The gate electrode is disposed on the gate insulating film. The source electrode is disposed on the first semiconductor layer, and is electrically connected with the source region. The drain electrode is disposed on a back side of the semiconductor substrate.

The temperature sensor includes a sensing-body region, a first region of the first conductivity type, a second region of the first conductivity type, a third region of the second conductivity type, a temperature-sensing conductive layer of the first conductivity type, a first electrode, and a second electrode. The sensing-body region is disposed in the first semiconductor layer, and is in contact with a surface of the first semiconductor layer. The first region and the second region are arranged in the sensing-body region and are apart from each other. The third region is in the sensing-body region and is between the first region and the second region. The temperature-sensing conductive layer is disposed on the first semiconductor layer, and is in contact with part of the first region, the third region, and part of the second region. The first electrode is electrically connected with the first region and the sensing-body region. The second electrode is electrically connected with the second region. A concentration of a first conductivity type impurity in the temperature-sensing conductive layer is higher than a concentration of a first conductivity type impurity in the drift region.

A present description discloses a semiconductor device that provides a semiconductor device that has a temperature sensing function that accurately senses a temperature.

BRIEF DESCRIPTION OF THE DRAWINGS

FIG. 2B is an enlarged plan view that exemplifies part of the semiconductor device according to the exemplary embodiment;

DETAILED DESCRIPTION

Figure 1A:
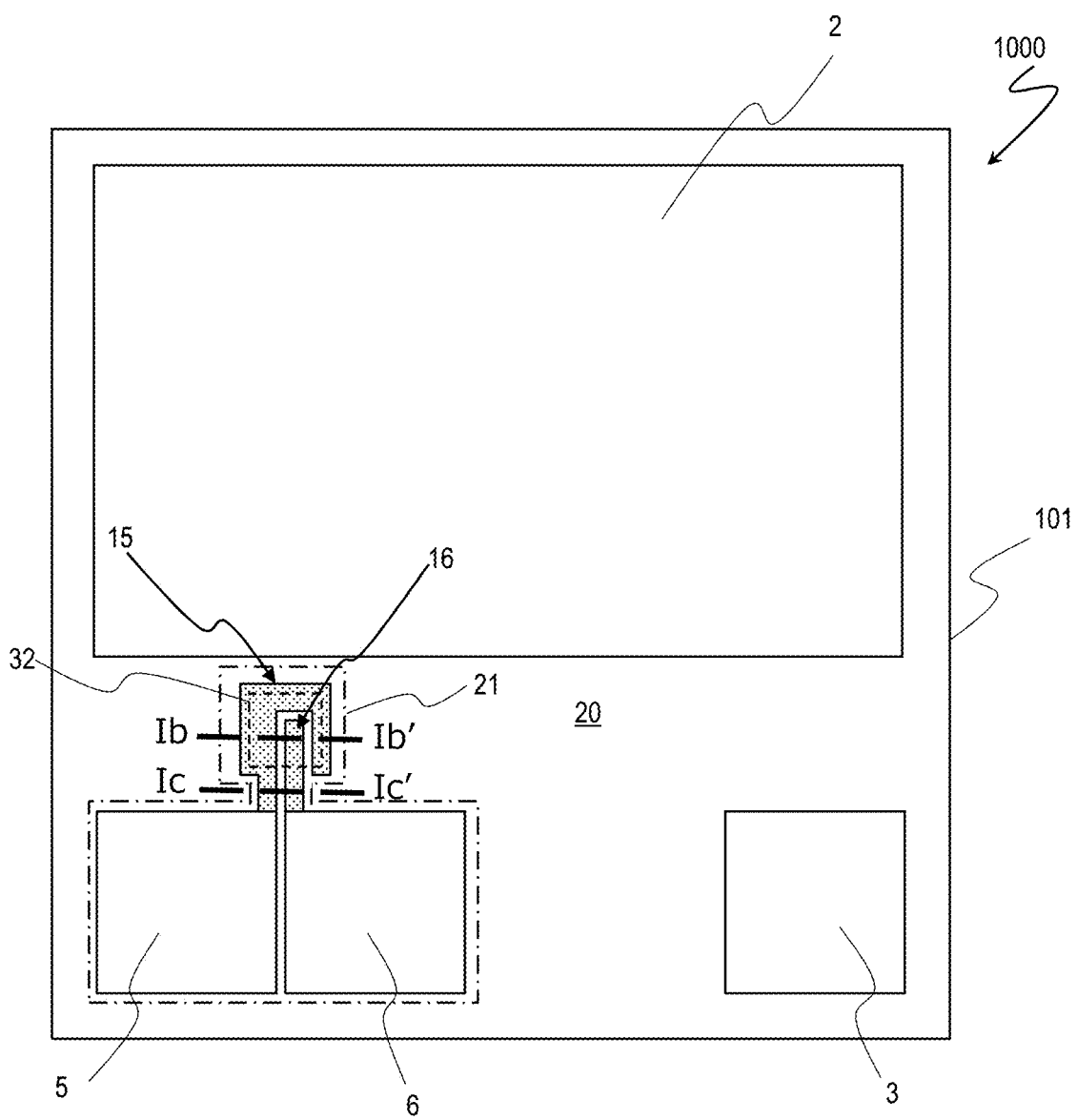
FIG. 1A is a schematic plan view of a semiconductor device according to an exemplary embodiment.

An outline of a semiconductor device according to the present disclosure will be described below.

A semiconductor device according to an aspect of the present disclosure includes a semiconductor substrate of a first conductivity type, and a first semiconductor layer that includes a main area and a temperature sensing area on a main side of the semiconductor substrate. The main area includes a plurality of unit cells. The temperature sensing area includes a temperature sensor.

The first semiconductor layer is on the main side of the semiconductor substrate.

The plurality of unit cells are arranged in the main area of the semiconductor substrate, and are connected with each other in parallel.

The temperature sensor is disposed in the temperature sensing area of the semiconductor substrate.

Each of the plurality of unit cells includes a main-body region of a second conductivity type, a source region of the first conductivity type, a drift region of the first conductivity type, a gate insulating film, a gate electrode, a source electrode, and a drain electrode. The main-body region is disposed in the first semiconductor layer, and is in contact with a surface of the first semiconductor layer. The source region is in the main-body region. The drift region is disposed in a region of the first semiconductor layer except the main-body region and the source region. The gate insulating film is disposed on the first semiconductor layer. The gate electrode is disposed on the gate insulating film. The source electrode is disposed on the first semiconductor layer, and is electrically connected with the source region. The drain electrode is disposed on a back side of the semiconductor substrate.

The temperature sensor includes a sensing-body region, a first region of the first conductivity type, a second region of the first conductivity type, a third region of the second conductivity type, a temperature-sensing conductive layer of the first conductivity type, a first electrode, and a second electrode. The sensing-body region is disposed in the first semiconductor layer, and is in contact with a surface of the first semiconductor layer. The first region and the second region are arranged in the sensing-body region and are apart from each other. The third region is in the sensing-body region and is between the first region and the second region. The temperature-sensing conductive layer is disposed on the first semiconductor layer, and is in contact with part of the first region, the third region, and part of the second region. The first electrode is electrically connected with the first region and the sensing-body region. The second electrode is electrically connected with the second region. A concentration of a first conductivity type impurity in the temperature-sensing conductive layer is higher than a concentration of a first conductivity type impurity in the drift region.

TheThe temperature sensing area may further include a separating portion that electrically separates the temperature sensor from the plurality of unit cells in the main area. The separating portion may be disposed in the first semiconductor layer, and may be apart from the sensing-body region. The separating portion may include: a separating-body region of the second conductivity type that is in contact with a surface of the first semiconductor layer, and is electrically connected with the source electrode; and a fourth region of the first conductivity type that is part of the first semiconductor layer and is between the separating-body region and the sensing-body region.

The separating portion may further include a separation assisting layer of the first conductivity type that is disposed on the first semiconductor layer, and is in contact with the fourth region. A concentration of a first conductivity type impurity in the separation assisting layer may be higher than a concentration of a first conductivity type impurity in the drift region. The separation assisting layer may be electrically separated from the temperature-sensing conductive layer.

For example, a concentration of a first conductivity type impurity in the fourth region may be higher than a concentration of a first conductivity type impurity in the drift region.

A concentration of a first conductivity type impurity in the temperature-sensing conductive layer may range from $1\times10^{17}$ cm$^{-3}$ to $1\times10^{19}$ cm$^{-3}$ inclusive, for example.

The temperature-sensing conductive layer may have a shape like an island.

When the first region is seen in a direction perpendicular to the main side of the semiconductor substrate, the first region may be disposed in such a manner that the first region surrounds the second region, and the third region may be disposed between the first region and the second region, for example.

For example, each of the plurality of unit cells may further include a channel layer of the first conductivity type. The channel layer is disposed between the first semiconductor layer and the gate insulating film in such a manner that the channel layer is in contact with at least the main-body region. A concentration of a first conductivity type impurity in the channel layer may be higher than a concentration of a first conductivity type impurity in the drift region.

The temperature sensor may further include a sensing-body contact region of the second conductivity type that is in the sensing-body region. A concentration of a second conductivity type impurity in the sensing-body contact region is higher than a concentration of a second conductivity type impurity in the sensing-body region. The sensing-body contact region may be in contact with the first electrode.

The main-body region and the sensing-body region may have an equal concentration profile of a second conductivity type impurity in depth directions of the main-body region and the sensing-body region.

The first semiconductor layer may be a silicon carbide semiconductor layer, for example.

Exemplary Embodiment

Hereinafter, a semiconductor device according to an exemplary embodiment of the present disclosure will be described with reference to the drawings. A silicon carbide semiconductor device will be exemplified. The semiconductor device according to the present exemplary embodiment may include a semiconductor device that includes semiconductor that is not silicon carbide. The semiconductor device according to the exemplary embodiment may be a silicon semiconductor device.

FIG. 1A is a schematic plan view of semiconductor device 1000 according to the present exemplary embodiment.

Semiconductor device 1000 includes semiconductor substrate 101, a plurality of unit cells (not illustrated) supported on semiconductor substrate 101, and temperature sensor 32 supported on semiconductor substrate 101. The unit cells are MISFETs, for example.

The plurality of unit cells are arranged in area 20 of semiconductor device 1000. In the present description, area 20 is referred to as a "main area". Temperature sensor 32 is disposed in area 21 of semiconductor device 1000. Area 21 is referred to as a "temperature sensing area".

On a main side of semiconductor substrate 101, electrode pads, such as source pad 2, gate pad 3, first pad 5, and second pad 6, and first electrode 15 and second electrode 16 of temperature sensor 32 are arranged. Source pad 2, gate pad 3, first pad 5, and second pad 6 are electrically insulated from each other. First electrode 15 is electrically connected with first pad 5. Second electrode 16 is electrically connected with second pad 6. One of first electrode 15 and second electrode 16 is an "anode electrode". The other electrode is a "cathode electrode". In the present description, one of first pad 5 and second pad 6 connected with the anode electrode may be referred to as an "anode pad". The other electrode pad connected with the cathode electrode may be referred to as a "cathode pad".

At least part of source pad 2 is disposed in main area 20. First pad 5 and second pad 6 are arranged in temperature sensing area 21, for example.

Next, a configuration of semiconductor device 1000 will be more specifically described.

Cross-Sectional Configuration of Semiconductor Device 1000

Figure 1B:
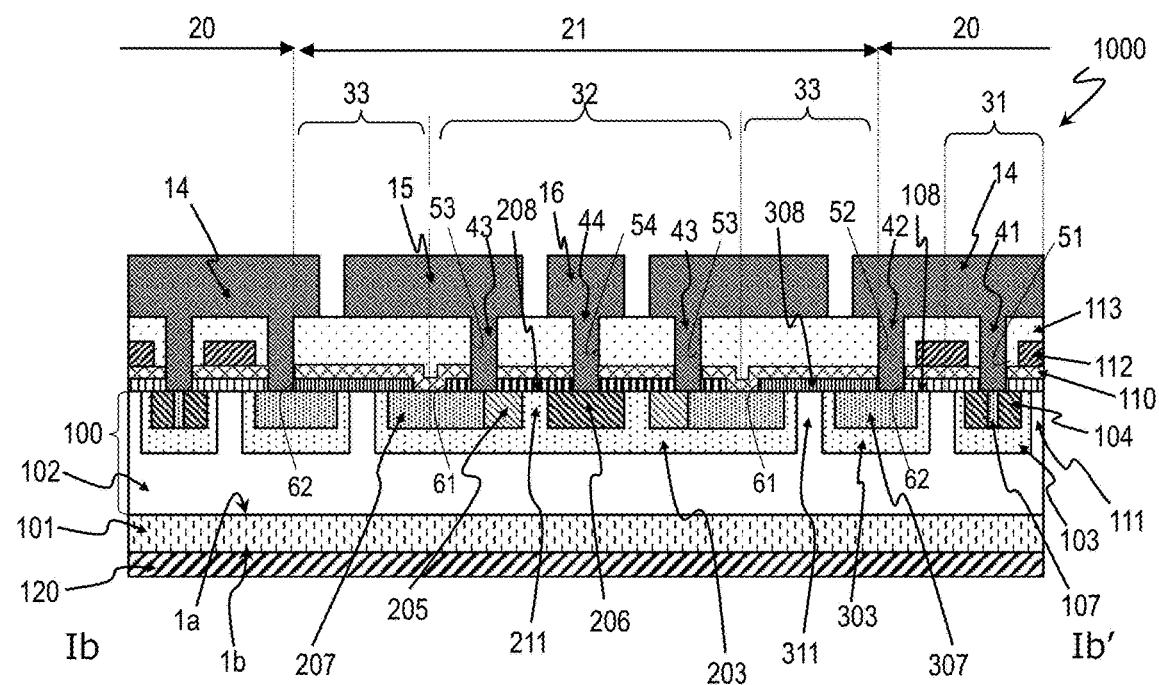
FIG. 1B is a schematic cross-sectional view of unit cells, a temperature sensor, and a separating portion in the semiconductor device according to the exemplary embodiment.
Figure 1C:
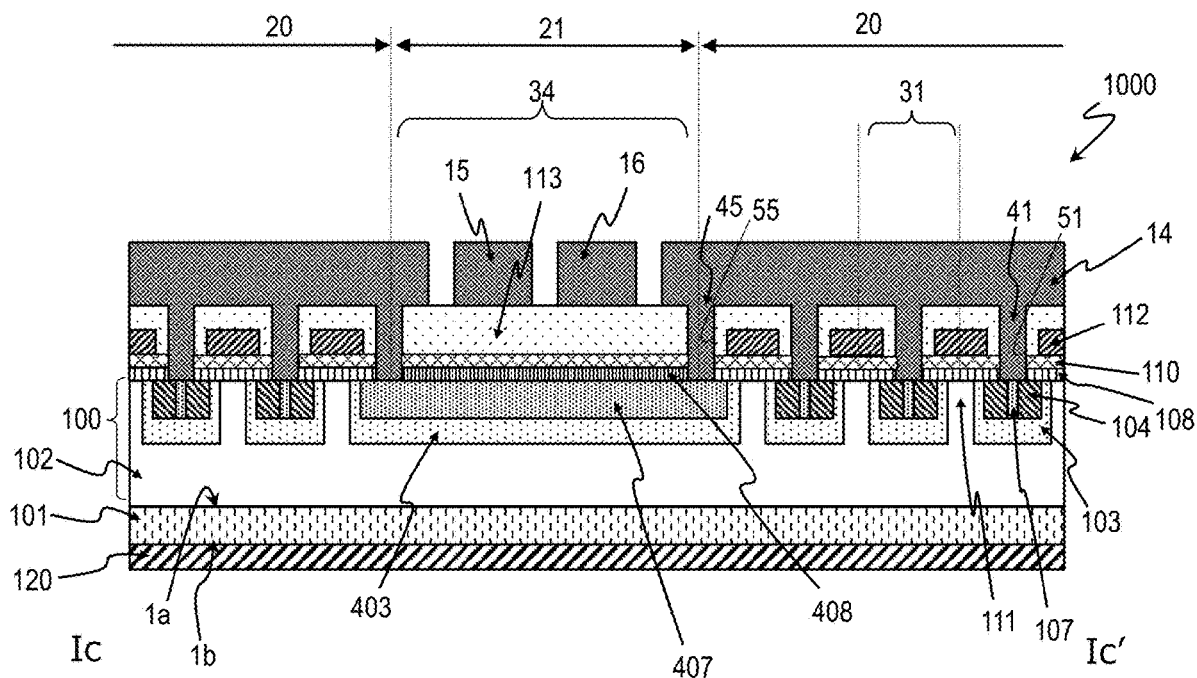
FIG. 1C is a schematic cross-sectional view of unit cells and a wiring portion in the semiconductor device according to the exemplary embodiment.

FIG. 1B is a schematic cross-sectional view of main area 20 of semiconductor device 1000. FIG. 1C is a schematic cross-sectional view of temperature sensing area 21 of semiconductor device 1000. FIG. 1B illustrates a cross-sectional configuration along line Ib-Ib' in FIG. 1A. FIG. 1C illustrates a cross-sectional configuration along line Ic-Ic' in FIG. 1A.

Semiconductor device 1000 includes semiconductor substrate 101 of a first conductivity type, and a first silicon carbide semiconductor layer (also referred to as a "first semiconductor layer") 100 of the first conductivity type disposed on main side 1a of semiconductor substrate 101. First silicon carbide semiconductor layer 100 is a silicon carbide epitaxial layer, for example. Drain electrode 120 is disposed on back side 1b of semiconductor substrate 101.

Main area 20 of semiconductor device 1000 includes a plurality of unit cells 31. Unit cells 31 are connected with each other in parallel. Temperature sensing area 21 includes temperature sensor 32. Temperature sensing area 21 may also include separating portion 33 and wiring portion 34. Separating portion 33 is a region that separates temperature sensor 32 from unit cells 31 of main area 20. In wiring portion 34, wiring that connects temperature sensor 32 with the cathode pad and the anode pad, the cathode pad, and the anode pad are arranged.

Hereinafter, configurations of unit cells 31, temperature sensor 32, separating portion 33, and wiring portion 34 will be described.

<Unit Cell 31>

In first silicon carbide semiconductor layer 100, each of unit cells 31 includes main-body region (also referred to as base area) 103 of a second conductivity type, source region 104 of the first conductivity type, and drift region 102 of the first conductivity type.

Main-body regions 103 are arranged in first silicon carbide semiconductor layer 100 in such a manner that main-body regions 103 are in contact with a surface of first silicon carbide semiconductor layer 100. A concentration of a first conductivity type impurity in source regions 104 is higher than a concentration of a first conductivity type impurity in drift region 102. Source regions 104 are arranged in respective main-body regions 103. Source regions 104 extend from the surface of first silicon carbide semiconductor layer 100 to an inside of first silicon carbide semiconductor layer 100. Main-body contact areas 107 are also arranged in respective main-body regions 103. Main-body contact areas 107 extend from the surface of first silicon carbide semiconductor layer 100 to the inside of first silicon carbide semiconductor layer 100. Main-body contact areas 107 are concentrated second conductivity type areas. A concentration of a second conductivity type impurity in main-body contact areas 107 is higher than a concentration of a second conductivity type impurity in main-body regions 103. Drift region 102 is disposed in a region of first silicon carbide semiconductor layer 100 where main-body regions 103, source regions 104, and main-body contact areas 107 are not formed. Regions 111 are part of drift region 102, and are each between main-body regions 103 that are adjacent to each other. In the present description, regions 111 may be referred to as "junction field effect transistor (JFET) regions". As described later, a concentration of a first conductivity type impurity in JFET regions 111 is higher than a concentration of a first conductivity type impurity in drift region 102.

Each of unit cells 31 may also include channel layer 108 of the first conductivity type. Channel layer 108 is disposed on first silicon carbide semiconductor layer 100. For example, channel layer 108 is a silicon carbide semiconductor layer whose concentration of a first conductivity type impurity is higher than a concentration of a first conductivity type impurity in drift region 102. A concentration of a first conductivity type impurity in channel layer 108 may be lower than a concentration of a first conductivity type impurity in source regions 104. Channel layer 108 only needs to be disposed in such a manner that channel layer 108 is in contact with at least main-body regions 103 of unit cells 31. Channel layer 108 may be disposed on part of a front side of first silicon carbide semiconductor layer 100, for example. More specifically, channel layer 108 may be disposed on at least part of source regions 104, main-body regions 103, and part of JFET regions 111, for example.

Gate insulating film 110 is disposed on channel layer 108. Gate electrodes 112 are disposed on gate insulating film 110. Interlayer dielectric 113 is disposed on gate electrodes 112 in such a manner that interlayer dielectric 113 covers unit cells 31. Source electrode 14 is disposed on interlayer dielectric 113. Source regions 104 of unit cells 31 are each electrically connected with source electrode 14. In this example, in a plurality of openings (that may be referred to as "source contact openings") 51 formed through interlayer dielectric 113, source electrode 14 is connected with source regions 104 of the plurality of unit cells 31. Connections 41 between source regions 104 and source electrode 14 are referred to as "source connections".

Source electrode 14 is electrically connected with a source pad, and gate electrodes 112 are electrically connected with a gate pad. However, the electrical connections are not illustrated. On the other hand, drain electrode 120 is disposed on back side 1b of semiconductor substrate 101.

Such unit cells 31 operate as normally-OFF MISFETs, for example. If voltage Vds is applied between the drain and the source, and a voltage higher than or equal to a threshold voltage is applied to gate electrode 112, electric current flows through channel layer 108 under gate electrode 112. Therefore, drain current flows from drain electrode 120 through semiconductor substrate 101, drift region 102, channel layer 108, and source region 104 to source electrode 14 (ON state).

<Temperature Sensor 32>

As illustrated in FIG. 1B, temperature sensor 32 includes sensing-body region 203 of the second conductivity type, first region 205 of the first conductivity type, second region 206 of the first conductivity type, third region 211 of the second conductivity type, first electrode 15 and second electrode 16, and temperature-sensing conductive layer 208 of the first conductivity type. First region 205 and second region 206, and third region 211 between first region 205 and second region 206 form an npn junction if the first conductivity type is n-type, and the second conductivity type is p-type. Alternatively, first region 205 and second region 206, and third region 211 between first region 205 and second region 206 form a pnp junction if the first conductivity type is p-type, and the second conductivity type is n-type.

If the first conductivity type is n-type and the second conductivity type is p-type, first electrode 15 is an anode electrode, second electrode 16 is a cathode electrode, first region 205 is an anode region, and second region 206 is a cathode region. If the first conductivity type is p-type and the second conductivity type is n-type, first electrode 15 is a cathode electrode, second electrode 16 is an anode electrode, first region 205 is a cathode region, and second region 206 is an anode region.

Sensing-body region 203 is disposed in first silicon carbide semiconductor layer 100. Sensing-body region 203 is in contact with the surface of first silicon carbide semiconductor layer 100. First region 205 and second region 206 are in sensing-body region 203, and are apart from each other. First region 205 and second region 206 extend from the surface of first silicon carbide semiconductor layer 100 to the inside of first silicon carbide semiconductor layer 100. In the illustrated cross section, first region 205 is disposed on both sides of second region 206. However, first region 205 may be disposed on only one side of second region 206.

Third region 211 is part of sensing-body region 203, and is between first region 205 and second region 206. Third region 211 extends from a surface of sensing-body region 203 to an inside of sensing-body region 203. In the example, third region 211 is part of sensing-body region 203. A concentration of a second conductivity type impurity in third region 211 is equal to a concentration of a second conductivity type impurity in sensing-body region 203.

Second region 206 is electrically connected with second electrode 16. First region 205 is electrically connected with first electrode 15 and sensing-body region 203. Sensing-body region 203 and first region 205 have an equal electric potential.

Sensing-body contact region 207 may be disposed in sensing-body region 203. Sensing-body contact region 207 extends from the surface of first silicon carbide semiconductor layer 100 to the inside of first silicon carbide semiconductor layer 100. A concentration of a second conductivity type impurity in sensing-body contact region 207 is higher than a concentration of a second conductivity type impurity in sensing-body region 203. Therefore, sensing-body contact region 207 is a concentrated second conductivity type area. In the example, sensing-body region 203 is electrically connected with first electrode 15 through sensing-body contact region 207. Sensing-body region 203 may be directly in contact with first electrode 15.

Drift region 102 extends through a region of first silicon carbide semiconductor layer 100 where sensing-body region 203, sensing-body contact region 207, first region 205, and second region 206 are not arranged.

Temperature-sensing conductive layer 208 is disposed on first silicon carbide semiconductor layer 100. On the surface of first silicon carbide semiconductor layer 100, temperature-sensing conductive layer 208 is in contact with part of first region 205, third region 211, and part of second region 206. Temperature-sensing conductive layer 208 only needs to be disposed across third region 211 to connect second region 206 with first region 205. In the illustrated example, temperature-sensing conductive layer 208 is in contact with first electrode 15 and second electrode 16. However, temperature-sensing conductive layer 208 may not be in contact with first electrode 15 and second electrode 16.

Temperature-sensing conductive layer 208 is a semiconductor layer of the first conductivity type. A concentration of a first conductivity type impurity in temperature-sensing conductive layer 208 is higher than a concentration of a first conductivity type impurity in drift region 102. For example, a concentration of a first conductivity type impurity in temperature-sensing conductive layer 208 may be higher than a concentration of a first conductivity type impurity in drift region 102, and may be lower than a concentration of a first conductivity type impurity in each of first region 205 and second region 206. A concentration of a first conductivity type impurity in temperature-sensing conductive layer 208 may range from $1 \times 10^{17}$ cm$^{-3}$ to $1 \times 10^{19}$ cm$^{-3}$ inclusive, for example. A thickness of temperature-sensing conductive layer 208 is not particularly limited. However, the thickness of temperature-sensing conductive layer 208 may be thicker than or equal to 20 nm, and may be thinner than a thickness of first region 205 and a thickness of a second region 206. A concentration of an impurity and a thickness of each of the areas of temperature sensor 32 and temperature-sensing conductive layer 208 is appropriately adjusted to allow temperature sensor 32 to have energy band structures described later with reference to FIGS. 3B and 3C. A dosage that is a product of a concentration of an impurity and a thickness of temperature-sensing conductive layer 208 (a concentration of an impurity×a thickness) may be adjusted to range from $1.0 \times 10^{11}$ cm$^{-2}$ to $1.0 \times 10^{13}$ cm$^{-2}$ inclusive, for example.

Interlayer dielectric 113 extends on temperature-sensing conductive layer 208. As illustrated in FIG. 1B, gate insulating film 110 may extend between interlayer dielectric 113 and temperature-sensing conductive layer 208. Interlayer dielectric 113 includes first opening 53 and second opening 54. First opening 53 is formed in such a manner that first opening 53 exposes part of first region 205, and part of sensing-body contact region 207 (or part of sensing-body region 203). Second opening 54 is formed in such a manner that second opening 54 exposes part of second region 206. When second opening 54 is seen in a direction perpendicular to substrate 101, whole second opening 54 overlaps second region 206.

First electrode 15 is disposed on interlayer dielectric 113 and in first opening 53. In first opening 53, first electrode 15 is connected with first region 205, and sensing-body region 203 or sensing-body contact region 207. Second electrode 16 is disposed on interlayer dielectric 113 and in second opening 54. In second opening 54, second electrode 16 is connected with second region 206. In the present description, connection 43 that electrically connects first region 205 and sensing-body region 203 with first electrode 15 is referred to as a "first connection". Further, connection 44 that electrically connects second region 206 with second electrode 16 is referred to as a "second connection".

First electrode 15 and second electrode 16 may be connected with a controller that is not illustrated and is disposed outside.

Simultaneous ion implantation may form sensing-body region 203 and main-body regions 103. In that case, sensing-body region 203 and main-body regions 103 may have an equal concentration profile of a first conductivity type impurity in depth directions of sensing-body region 203 and main-body regions 103. Similarly, simultaneous ion implantation may form second region 206, first region 205, and source region 104. Second region 206, first region 205, and source region 104 may have an equal concentration profile of a first conductivity type impurity in depth directions of second region 206, first region 205, and source region 104. Further, simultaneous ion implantation may form sensing-body contact region 207 and main-body contact areas 107. Sensing-body contact region 207 and main-body contact areas 107 may have an equal concentration profile of a second conductivity type impurity in depth directions of sensing-body contact region 207 and main-body contact areas 107.

Temperature-sensing conductive layer 208 may be made of a semiconductor film that is same as channel layer 108 (same silicon carbide semiconductor film in this case). In this case, temperature-sensing conductive layer 208 and channel layer 108 may have an equal thickness and an equal concentration of a first conductivity type impurity.

Operation of temperature sensor 32 will be described. In the description, the first conductivity type is n-type, and the second conductivity type is p-type, for example. Forward voltage (referred to as a "anode-to-cathode voltage") Vac is applied between first electrode 15 and second electrode 16 to allow constant forward electric current flow between first electrode 15 and second electrode 16. The forward electric current flows from first region 205 that is an anode region, through temperature-sensing conductive layer 208, to second region 206 that is a cathode region. Due to conduction and switching losses of semiconductor device 1000, a temperature of the surface of first silicon carbide semiconductor layer 100 increases. A rise in temperature decreases anode-to-cathode voltage Vac. Therefore, the temperature of the surface of first silicon carbide semiconductor layer 100 (junction temperature) is sensed by measuring anode-to-cathode voltage Vac.

If anode-to-cathode voltage Vac is applied to temperature sensor 32 in the present exemplary embodiment, electrons in second region 206 that is a cathode region are injected into temperature-sensing conductive layer 208, and moves to an anode side through temperature-sensing conductive layer 208. Even if anode-to-cathode voltage Vac is applied, electrons are not likely to be injected from second region 206 to sensing-body region 203. Therefore, operation of a parasitic bipolar junction transistor that includes second region 206, sensing-body region 203, and drift region 102 is restricted, as described later. Therefore, a junction temperature is precisely sensed by using anode-to-cathode voltage Vac that depends on a temperature. Consequently, a range of temperatures within which semiconductor device 1000 operates is extended to near a maximum junction temperature (e.g., approximately 175° C.). Therefore, power density of the semiconductor device can be further increased.

If the first conductivity type is p-type and the second conductivity type is n-type, temperature sensor 32 operates similarly as temperature sensor 32 described above. However, an anode region is second region 206, and a cathode region is first region 205.

<Separating Portion 33>

As illustrated in FIG. 1B, separating portion 33 includes separating-body region 303 of the second conductivity type. Separating-body region 303 is disposed in first silicon carbide semiconductor layer 100, and is apart from sensing-body region 203. Further, separating portion 33 includes fourth region 311 of the first conductivity type. Fourth region 311 is part of first silicon carbide semiconductor layer 100 and is between separating-body region 303 and sensing-body region 203. Separating-body region 303 is electrically connected with source electrode 14. Separation assisting layer 308 of the first conductivity type may be disposed on at least part of fourth region 311.

Separating-body region 303 is in contact with the surface of first silicon carbide semiconductor layer 100. In the example, separating-body region 303 is disposed between sensing-body region 203 and main-body regions 103. Further, separating-body region 303 is apart from sensing-body region 203 and main-body regions 103. Separating-body region 303 may contain separating-body contact area 307. A concentration of a second conductivity type impurity in separating-body contact area 307 is higher than a concentration of a second conductivity type impurity in separating-body region 303. Separating-body region 303 may be connected with source electrode 14 through separating-body contact area 307.

Fourth region 311 may be part of drift region 102. Alternatively, fourth region 311 may be a concentrated first conductivity type area. A concentration of a first conductivity type impurity in fourth region 311 may be higher than a concentration of a first conductivity type impurity in drift region 102. Since fourth region 311 has a high concentration of a first conductivity type impurity, separation performance of fourth region 311 can be improved.

Separation assisting layer 308 is disposed on first silicon carbide semiconductor layer 100, and is in contact with fourth region 311. A concentration of a first conductivity type impurity in separation assisting layer 308 may be higher than a concentration of a first conductivity type impurity in drift region 102.

Preferably, separation assisting layer 308 is electrically separated from temperature-sensing conductive layer 208. An investigation by the present inventors reveals that if temperature-sensing conductive layer 208 is connected with separation assisting layer 308, a short circuit may occur between first region 205 and drift region 102 through temperature-sensing conductive layer 208 and separation assisting layer 308. The detail will be described later.

Separation assisting layer 308, temperature-sensing conductive layer 208, and channel layer 108 may be electrically separated from each other. For example, separation assisting layer 308 may be disposed between temperature-sensing conductive layer 208 and channel layer 108, and may be apart from temperature-sensing conductive layer 208 and channel layer 108, as illustrated in FIG. 1B. In the example, separation assisting layer 308, temperature-sensing conductive layer 208, and channel layer 108 are made of a same silicon carbide semiconductor film (referred to as a "second silicon carbide semiconductor layer"). Third opening 61 formed through the second silicon carbide semiconductor layer separates separation assisting layer 308 from temperature-sensing conductive layer 208. Similarly, fourth opening 62 formed through the second silicon carbide semiconductor layer separates separation assisting layer 308 from channel layer 108.

Separation assisting layer 308 only needs to be in contact with at least part of fourth region 311. Separation assisting layer 308 may be formed across separating portion 33, or may be disposed across part of separating portion 33.

Interlayer dielectric 113 extends over separation assisting layer 308. As illustrated in FIG. 1B, gate insulating film 110 may extend between interlayer dielectric 113 and separation assisting layer 308. Interlayer dielectric 113 includes opening (that may be referred to as "separating-body contact opening") 52 that exposes part of separating-body region 303 or separating-body contact area 307. Source electrode 14 is disposed on interlayer dielectric 113 and in separating-body contact opening 52. In separating-body contact opening 52, source electrode 14 is electrically connected with separating-body region 303 or separating-body contact area 307. Connection 42 between source electrode 14 and separating-body region 303 is referred to as a "separating-body connection". Since separating-body region 303 is connected with source electrode 14, separating-body region 303 has electric potential that is equal to electric potential of main-body regions 103 and source regions 104 of unit cells 31.

In separating portion 33, part of first electrode 15 may be disposed on interlayer dielectric 113. Interlayer dielectric 113 electrically separates first electrode 15 from separating-body region 303 and separation assisting layer 308.

<Wiring Portion 34>

As illustrated in FIG. 1C, wiring portion 34 includes under-wiring body region 403 of the second conductivity type, and body cap layer 408 of the first conductivity type.

Under-wiring body region 403 is disposed in first silicon carbide semiconductor layer 100. Under-wiring body region 403 is in contact with the surface of first silicon carbide semiconductor layer 100. Under-wiring body region 403 is electrically separated from sensing-body region 203. Under-wiring contact region 407 may be connected with separating-body region 303 of separating portion 33.

Body cap layer 408 is disposed on first silicon carbide semiconductor layer 100 in such a manner that body cap layer 408 is in contact with under-wiring body region 403. For example, body cap layer 408 may be a concentrated impurity semiconductor layer whose concentration of a first conductivity type impurity is higher than a concentration of a first conductivity type impurity in drift region 102. Body cap layer 408 is separated from temperature-sensing conductive layer 208. Body cap layer 408 may be connected with separation assisting layer 308 of separating portion 33.

Under-wiring contact region 407 may be disposed in under-wiring body region 403. A concentration of a second conductivity type impurity in under-wiring contact region 407 is higher than a concentration of a second conductivity type impurity in under-wiring body region 403. Under-wiring contact region 407 may be connected with separating-body contact area 307 of separating portion 33.

A region of first silicon carbide semiconductor layer 100 except under-wiring body region 403 and under-wiring contact region 407 is drift region 102.

Interlayer dielectric 113 extends over body cap layer 408. As illustrated in FIG. 1C, gate insulating film 110 may extend between interlayer dielectric 113 and body cap layer 408. An anode electrode that is one of first electrode 15 and second electrode 16 extends on interlayer dielectric 113 to an anode pad. A cathode electrode that is the other one of first electrode 15 and second electrode 16 extends on interlayer dielectric 113 to a cathode pad. Part of the anode electrode that is between temperature sensor 32 and the anode pad may be referred to as "anode wiring". Part of the cathode electrode that is between temperature sensor 32 and the cathode pad may be referred to as "cathode wiring". Interlayer dielectric 113 electrically separates the anode wiring and the cathode wiring from under-wiring body region 403 and body cap layer 408.

Interlayer dielectric 113 includes opening (that may be referred to as an "opening-under-wiring") 55 that exposes part of under-wiring body region 403 or under-wiring contact region 407. Source electrode 14 is disposed on interlayer dielectric 113 and in opening-under-wiring 55 in such a manner that source electrode 14 is apart from first electrode 15 and second electrode 16 on interlayer dielectric 113. In opening-under-wiring 55, source electrode 14 is electrically connected with sensing-body region 203 or sensing-body contact region 207. Connection 45 between source electrode 14 and under-wiring body region 403 is referred to as a "body-under-wiring connection". Body-under-wiring connection 45 may be connected with separating-body connection 42.

Simultaneous ion implantation may form separating-body region 303, under-wiring body region 403, sensing-body region 203, and main-body regions 103. In that case, separating-body region 303, under-wiring body region 403, sensing-body region 203, and main-body regions 103 may have substantially an equal concentration profile of a second conductivity type impurity in depth directions of separating-body region 303, under-wiring body region 403, sensing-body region 203, and main-body regions 103. Similarly, simultaneous ion implantation may form separating-body contact area 307, under-wiring contact region 407, sensing-body contact region 207, and main-body contact areas 107. In that case, separating-body contact area 307, under-wiring contact region 407, sensing-body contact region 207, and main-body contact areas 107 may have substantially an equal concentration profile of a second conductivity type impurity in depth directions of separating-body contact area 307, under-wiring contact region 407, sensing-body contact region 207, and main-body contact areas 107.

Further, separation assisting layer 308, body cap layer 408, temperature-sensing conductive layer 208, and channel layer 108 may be made of a same semiconductor film (the second silicon carbide semiconductor layer in this case). In that case, separation assisting layer 308, body cap layer 408, temperature-sensing conductive layer 208, and channel layer 108 may have substantially an equal thickness and substantially an equal concentration of a first conductivity type impurity. Separation assisting layer 308 and body cap layer 408 may be integrally made and connected with each other.

Planar Configuration of Semiconductor Device
1000

Next, a planar configuration of semiconductor device 1000 will be described with reference to FIGS. 2A to 2C.

Figure 2A:
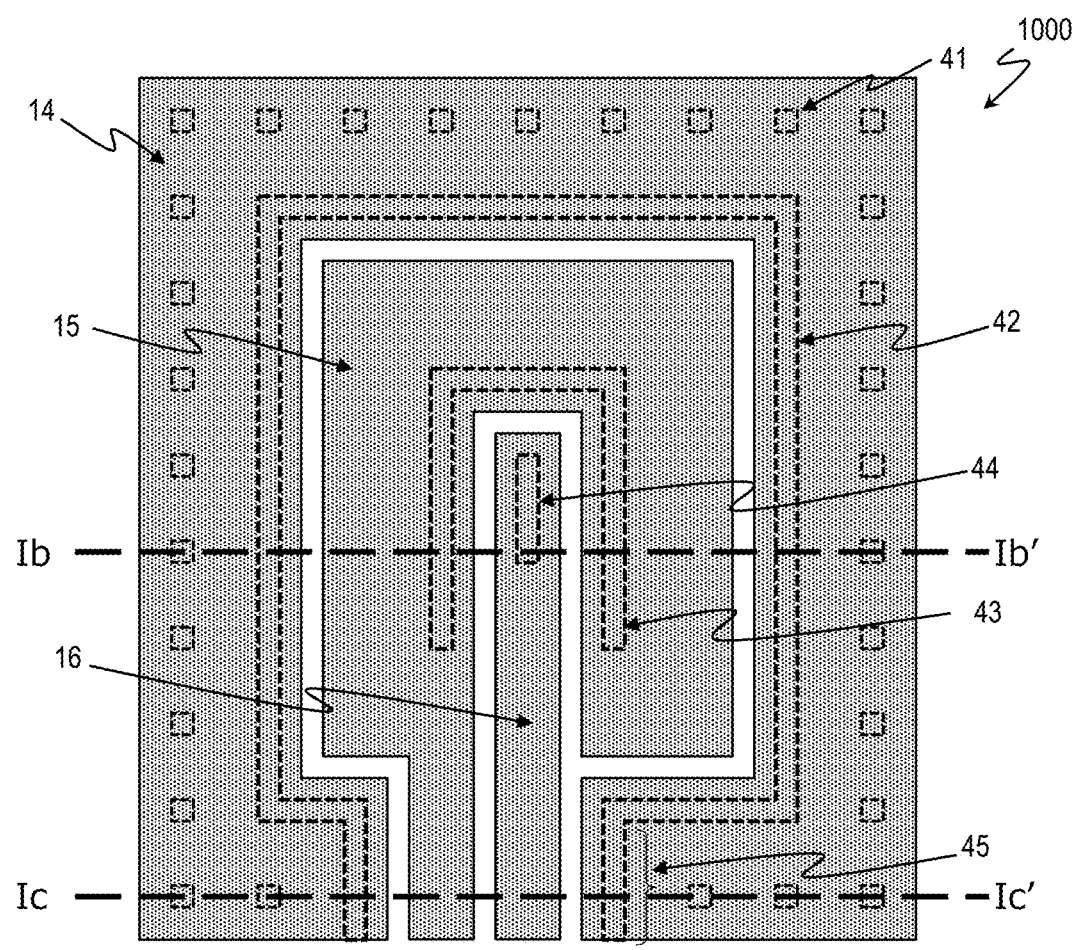
FIG. 2A is an enlarged plan view that exemplifies part of the semiconductor device according to the exemplary embodiment.
Figure 2C:
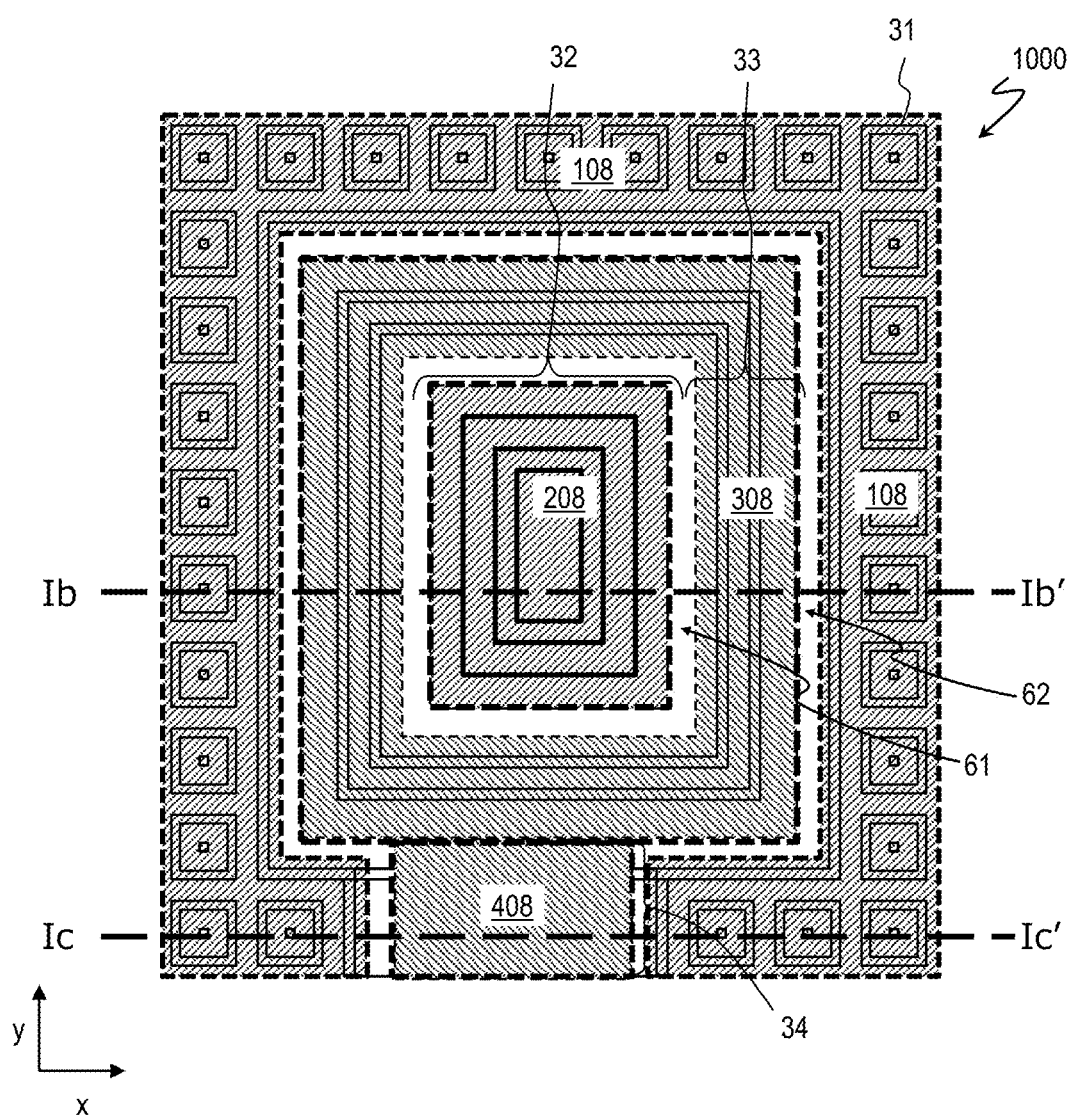
FIG. 2C is an enlarged plan view that exemplifies part of the semiconductor device according to the exemplary embodiment.

FIGS. 2A, 2B, and 2C are enlarged plan views that each exemplify temperature sensing area 21, and a boundary between temperature sensing area 21 and main area 20 in semiconductor device 1000. FIG. 2A illustrates an electrode configuration arranged on a main side of semiconductor substrate 101. FIG. 2A does not illustrate electrode pads for easy understanding. FIG. 2B illustrates a configuration of the surface of first silicon carbide semiconductor layer 100 disposed on semiconductor substrate 101. FIG. 2C illustrates shapes of channel layer 108, temperature-sensing conductive layer 208, separation assisting layer 308, and body cap layer 408 that are arranged on first silicon carbide semiconductor layer 100. FIGS. 2B and 2C each do not illustrate electrode pads and an electrode configuration for easy understanding.

As illustrated in FIG. 2A, source electrode 14, first electrode 15, and second electrode 16 are arranged on the main side of semiconductor substrate 101. Source electrode 14, first electrode 15, and second electrode 16 are apart from each other. Source electrode 14 may be disposed in such a manner that source electrode 14 surrounds a configuration of the pair of electrodes: first electrode 15 and second electrode 16.

A plurality of source connections 41 electrically connect source electrode 14 with the source regions (not illustrated) of the plurality of unit cells. Separating-body connection 42 electrically connects source electrode 14 with the separating-body region (not illustrated). Body-under-wiring connection 45 electrically connects source electrode 14 with the under-wiring body region (not illustrated). Second connection 44 electrically connects second electrode 16 with the second region (not illustrated) of the temperature sensor. First connection 43 electrically connects first electrode 15 with the first region and the sensing-body region of the temperature sensor. The first region and the sensing-body region are not illustrated.

In the example, when second electrode 16 is seen in a direction perpendicular to semiconductor substrate 101, second electrode 16 extends from the second pad not illustrated to substantially a center of the temperature sensor. In temperature sensor 32, first electrode 15 extends from the first pad not illustrated, and is U-shaped in such a manner that first electrode 15 surrounds an end of second electrode 16. Second connection 44 may be at the end of second electrode 16. First connection 43 may be U-shaped in such a manner that first connection 43 surrounds the end of second electrode 16.

Arrangements and shapes of source electrode 14, first electrode 15, second electrode 16, source connection 41, first connection 43, and second connection 44 are not limited to arrangements and shapes in the illustrated example. For example, a plurality of first connections 43 or a plurality of second connections 44 may be arranged in such a manner that the plurality of first connections 43 and/or the plurality of second connections 44 are apart from each other.

As illustrated in FIG. 2B, when temperature sensor 32 is seen in a direction perpendicular to semiconductor substrate 101, the plurality of unit cells 31 may surround temperature sensor 32. For example, temperature sensor 32 may be disposed at substantially a center of semiconductor substrate 101. Separating portion 33 may be disposed between temperature sensor 32 and the plurality of unit cells 31 in such a manner that separating portion 33 surrounds temperature sensor 32. Separating portion 33 may be disposed not only between temperature sensor 32 and unit cells 31 but also between temperature sensor 32 and wiring portion 34.

Next, the configuration of the surface of first silicon carbide semiconductor layer 100 will be described with reference to FIG. 2B. Main-body regions 103 of unit cells 31 are arranged in the main area on the surface of first silicon carbide semiconductor layer 100. Main-body regions 103 are apart from each other. Main-body regions 103 are each rectangular, for example. Source region 104 and main-body contact area 107 are arranged in each of main-body regions 103.

On semiconductor substrate 101, unit cells 31 may be two-dimensionally arranged in an x direction and a y direction. Unit cells 31 may be arranged in a lattice arrangement. Alternatively, unit cells 31 may be arranged in a staggered manner. However, unit cells 31 arranged in the staggered manner are not illustrated. More specifically, an arrangement of unit cells 31 in either x- or y-direction may be staggered by half a cycle.

When first region 205 is seen in a direction perpendicular to semiconductor substrate 101, first region 205 is disposed in such a manner that first region 205 surrounds second region 206. Third region 211 is between first region 205 and second region 206. The above configuration allows electric current to flow through a whole periphery of second region 206 surrounded by first region 205 (If second region 206 is rectangular, the whole periphery is whole four sides of second region 206). Therefore, a region needed for temperature sensor 32 is reduced, and current density of temperature sensor 32 is increased.

Arrangements of first region 205 and second region 206 are not limited to the illustrated example. In the present exemplary embodiment, at least one pair of first region 205 and second region 206 only need to be arranged in such a manner that third region 211 is between at least one pair of first region 205 and second region 206. For example, first region 205 may not surround second region 206.

Separating portion 33 may be disposed in such a manner that separating portion 33 surrounds temperature sensor 32. In the present exemplary embodiment, separating-body region 303 and separating-body contact area 307 are arranged in such a manner that separating-body region 303 and separating-body contact area 307 surround temperature sensor 32. Fourth region 311 is between sensing-body region 203 of temperature sensor 32 and separating-body region 303.

Wiring portion 34 is disposed between separating portion 33 and the anode pad and the cathode pad. Under-wiring body region 403 may be formed in such a manner that under-wiring body region 403 is connected with separating-body region 303.

As illustrated in FIG. 2C, channel layer 108, temperature-sensing conductive layer 208, separation assisting layer 308, and body cap layer 408 are arranged on first silicon carbide semiconductor layer 100. Channel layer 108, temperature-sensing conductive layer 208, separation assisting layer 308, and body cap layer 408 are formed by patterning one silicon carbide semiconductor film (second silicon carbide semiconductor layer).

In an example illustrated in FIG. 2C, temperature-sensing conductive layer 208 is disposed at temperature sensor 32 and is disposed like an island. Separation assisting layer 308 is disposed apart from temperature-sensing conductive layer 208, and surrounds temperature-sensing conductive layer 208. For example, third opening 61 of the second silicon carbide semiconductor layer separates separation assisting layer 308 from temperature-sensing conductive layer 208. Body cap layer 408 is disposed on an anode-pad side and a cathode-pad side of separation assisting layer 308. Body cap layer 408 may connect with separation assisting layer 308. Channel layer 108 is disposed outside body cap layer 408 and separation assisting layer 308 (a side opposite temperature sensor 32). Channel layer 108 is apart from body cap layer 408 and separation assisting layer 308. For example, fourth opening 62 of the second silicon carbide semiconductor layer separates channel layer 108 from body cap layer 408 and separates channel layer 108 from separation assisting layer 308.

Arrangements and shapes of the electrodes, and the layers, and the areas of semiconductor device 1000 are not limited to examples illustrated in FIGS. 2A to 2C. Further, other sensing areas and other electrode pads may also be provided.

Operation of Temperature Sensor 32

Hereinafter, operation of temperature sensor 32 according to the present exemplary embodiment will be described by comparing temperature sensor 32 with a temperature sensor in a conventional semiconductor device disclosed in PTL 1, for example.

Operation of Conventional Temperature Sensor

For example, PTL 1 discloses an SiC semiconductor device that includes, in an SiC substrate, a pn diode that functions as a temperature sensor, as described above. In the present description, such a pn diode will be referred to as a "temperature sensor diode".

An investigation by the present inventors reveals that it may be difficult for a conventional semiconductor device that includes a temperature sensor diode to accurately sense a junction temperature since a parasitic bipolar junction transistor is formed and operates at a temperature sensing area. Hereinafter, the parasitic bipolar junction transistor will be described in detail with reference to the drawings. In the description, the first conductivity type is n-type and the second conductivity type is p-type, for example. However, the first conductivity type may be p-type and the second conductivity type may be n-type.

Figure 8:
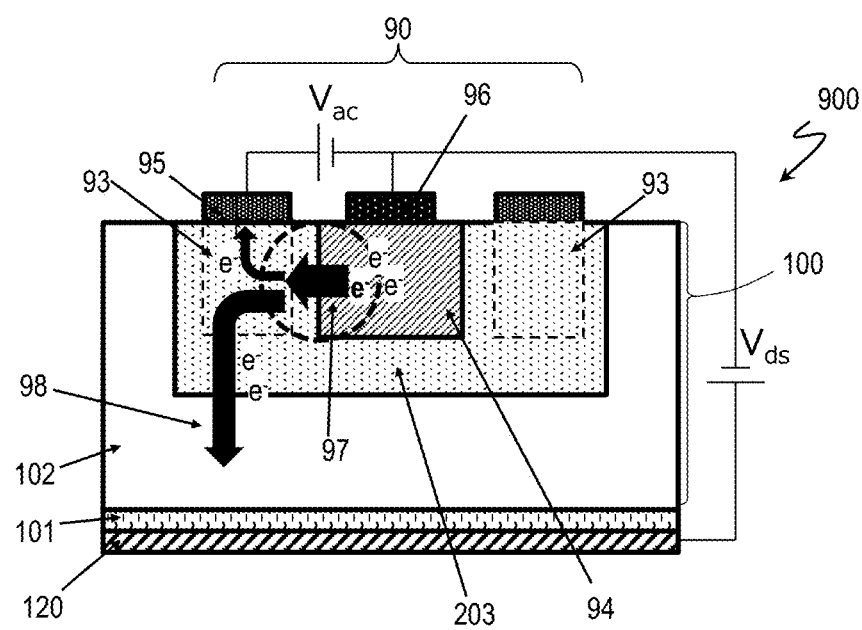
FIG. 8 is a schematic cross-sectional view that illustrates part of a semiconductor device as an example for reference.
Figure 9:
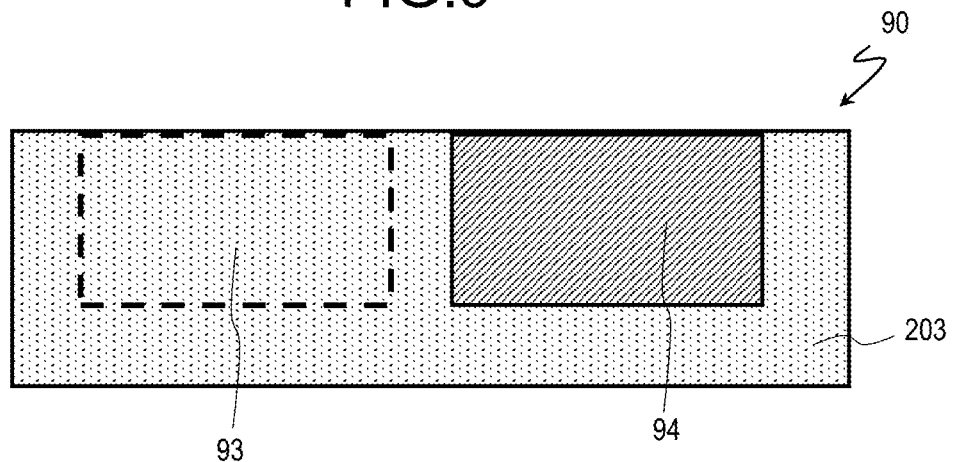
FIG. 9 is a schematic enlarged cross-sectional view of a temperature sensor diode as an example for reference.

FIG. 8 is a schematic cross-sectional view that illustrates part of semiconductor device 900 that is an example for reference and includes temperature sensor diode 90. FIG. 9 is an enlarged cross-sectional view of temperature sensor diode 90. In FIGS. 8 and 9, same reference numerals are assigned to components similar to components in FIG. 1B. Arrows whose lines are thick in FIG. 8 illustrate directions in which electrons flow. Electric current flows in directions opposite to the arrows.

Temperature sensor diode 90 of semiconductor device 900 is a pn diode that includes anode region 93 of p-type, and cathode region 94 of n-type. More specifically, temperature sensor diode 90 includes sensing-body region 203 of p-type formed in first silicon carbide semiconductor layer 100, cathode region 94 of n-type disposed in sensing-body region 203, and cathode electrode 96 and anode electrode 95 that are arranged on first silicon carbide semiconductor layer 100. Cathode electrode 96 is in contact with cathode region 94. Anode electrode 95 is in contact with part of sensing-body region 203. Part of sensing-body region 203 functions as the "anode region". The anode region is area 93 of p-type that is in contact with anode electrode 95 and is opposite cathode region 94.

If a voltage is not applied between the anode and the cathode in temperature sensor diode 90, an energy barrier exists at a junction between cathode region 94 and anode region 93. The energy barrier depends on a difference between conduction band energy and valence band energy, or a band gap. Suppose that electric potential (built-in potential) $V_{D1}$ that corresponds to the difference between the energies is 3 V. If forward voltage Vac that is higher than or equal to built-in potential $V_{D1}$ is applied between the anode and the cathode, the energy barrier at the junction between cathode region 94 of n-type and anode region 93 of p-type almost disappears. Consequently, electrons in cathode region 94 are injected into sensing-body region 203 (that includes anode region 93), as represented by arrow 97 in FIG. 8., and electric current starts to flow. However, since high Vds (e.g., 200 V or higher) is applied between source electrode 14 (source electrode 14 and cathode electrode 96 have equal electric potential) and drain electrode 120, most of electrons that have been injected into sensing-body region 203 do not flow to anode electrode 95 but flow to drift region 102, as represented by arrow 98. That is, even if it is intended that electric current is made to flow through temperature sensor diode 90, electric current flows more through a parasitic bipolar junction transistor (parasitic NPN transistor in this case) that includes cathode region 94, sensing-body region 203, and drift region 102 than through temperature sensor diode 90.

Figure 10A:
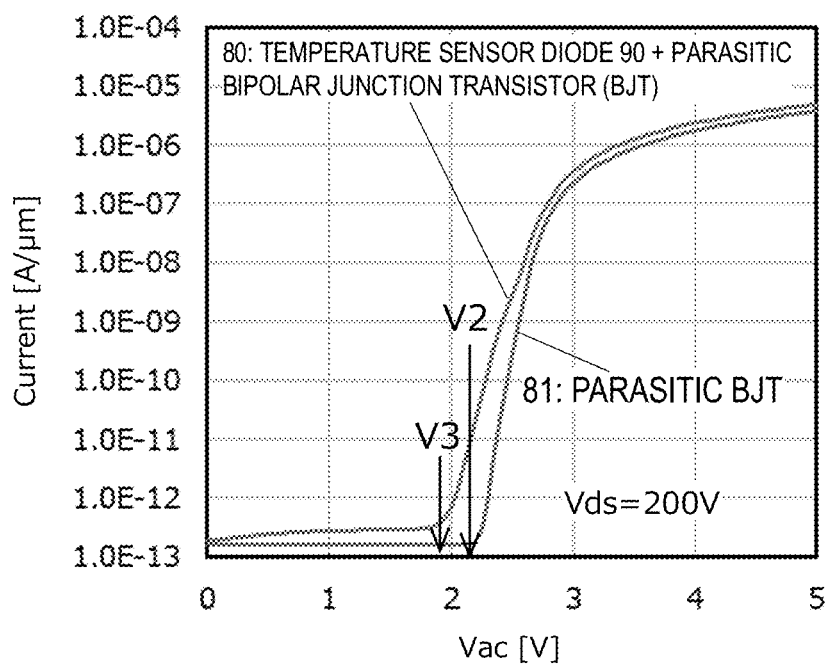
FIG. 10A is a graph that illustrates a relationship between anode-to-cathode voltage Vac and electric current in the semiconductor device as the example for reference.
Figure 10B:
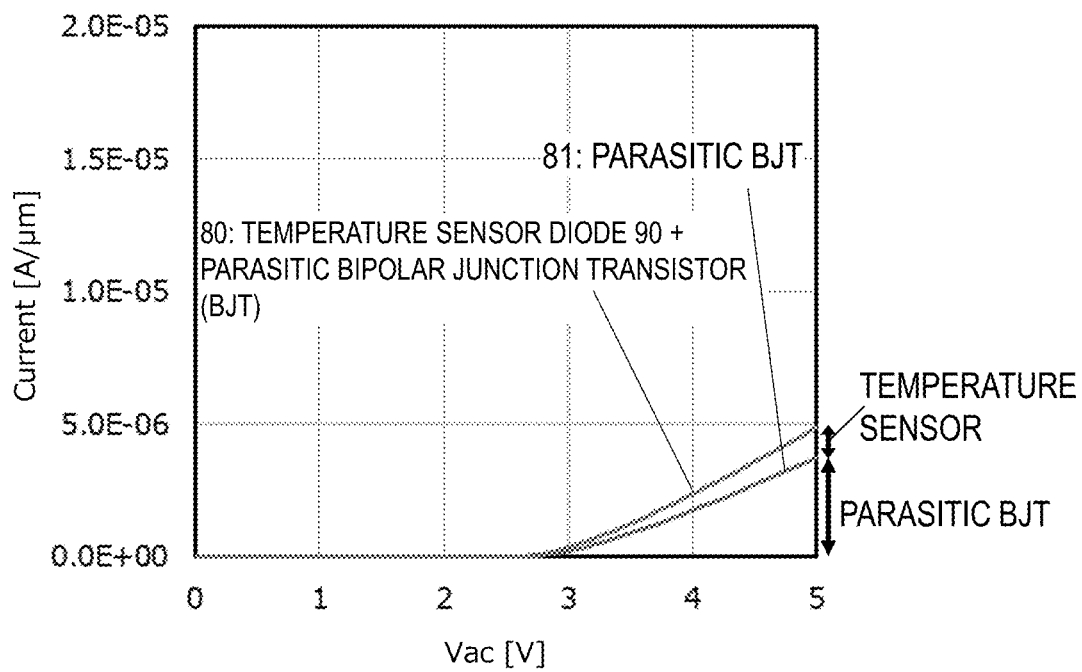
FIG. 10B is a graph that illustrates a relationship between anode-to-cathode voltage Vac and electric current in the semiconductor device as the example for reference.

FIGS. 10A and 10B are graphs that each illustrate a relationship between anode-to-cathode voltage Vac and electric current in semiconductor device 900 as a reference. In a simulation, drain-to-source voltage Vds is 200 V.

In FIGS. 10A and 10B, a horizontal axis represents anode-to-cathode voltage Vac, and a vertical axis represents electric current. Line 80 represents electric current that flows from cathode electrode 96. Line 81 represents electric current that flows into drain electrode 120. In the present description, the electric current that flows from cathode electrode 96 is a sum of electric current that flows through temperature sensor diode 90 and electric current that flows through the parasitic bipolar junction transistor. Further, the electric current that flows into drain electrode 120 represents electric current that flows through the parasitic bipolar junction transistor. Therefore, electric current that flows into drain electrode 120 (line 81) subtracted from electric current that flows from cathode electrode 96 (line 80) is "temperature sensing electric current" that flows from anode electrode 95 to cathode electrode 96. FIG. 10A uses a logarithmic scale for a vertical axis. FIG. 10B uses a linear scale for a vertical axis. However, FIGS. 10A and 10B illustrate a same result.

As seen from FIGS. 10A and 10B, in semiconductor device 900 as an example for reference, turn-on voltage V3 of temperature sensor diode 90 is slightly higher than turn-on voltage V2 of the parasitic bipolar junction transistor, and is approximately 2 V. Suppose that built-in potential $V_{D1}$ is 3 V. In that case, even if voltage Vac that is lower than built-in potential $V_{D1}$ (e.g., approximately 2 V) is applied between the anode and the cathode, sufficient temperature sensing electric current does not flow. A conceivable reason is that if voltage Vac is approximately 2 V, an energy barrier at a junction between cathode region 94 and anode region 93 becomes low but does not fully disappear. Therefore, electrons are not likely to be injected from cathode region 94 into sensing-body region 203.

On the other hand, if anode-to-cathode voltage Vac is higher than or equal to built-in potential $V_{D1}$, an energy barrier at a junction between cathode region 94 and anode region 93 almost disappears. Therefore, electrons are injected from cathode region 94 into sensing-body region 203. However, most electrons injected into sensing-body region 203 flow into drift region 102. Therefore, electrons do not selectively flow into anode electrode 95 through anode region 93. That is, it is seen that electric current does not selectively flow through temperature sensor diode 90 while operation of the parasitic bipolar junction transistor is restricted.

Operation of Temperature Sensor 32 According to Present Exemplary Embodiment

According to the present exemplary embodiment, temperature sensor 32 operates while operation of a parasitic bipolar junction transistor in the temperature sensing area is restricted. Further, voltage Vac applied between an anode and a cathode to allow temperature sensor 32 to operate is lower than built-in potential $V_{D1}$.

In a description below, the first conductivity type is n-type and the second conductivity type is p-type, for example. However, the first conductivity type may be p-type and the second conductivity type may be n-type.

Figure 3A:
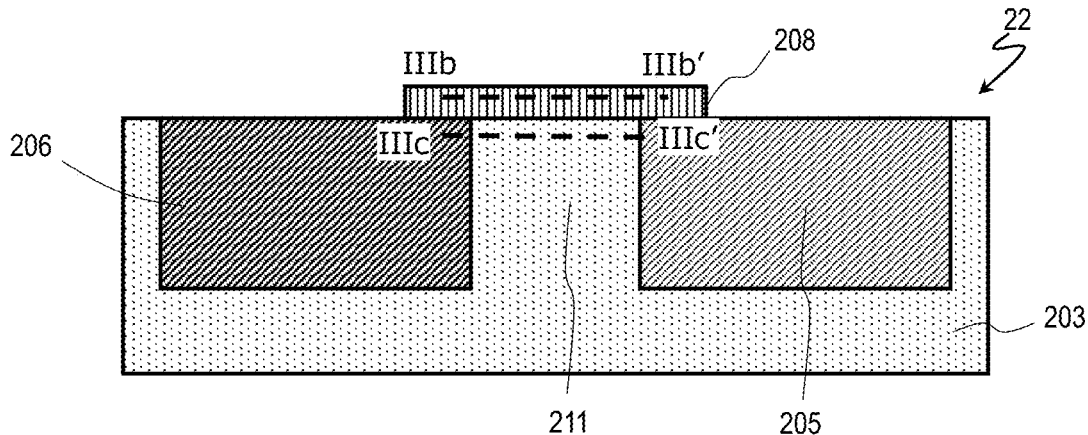
FIG. 3A is a schematic enlarged cross-sectional view of the temperature sensor.

FIG. 3A is a schematic enlarged cross-sectional view that illustrates temperature sensor 32 in the present exemplary embodiment.

Temperature sensor 32 includes an npn junction that includes first region 205 of n-type, second region 206 of n-type, and third region 211 of p-type. Third region 211 is between first region 205 and second region 206. Temperature-sensing conductive layer 208 is disposed on the npn junction. First region 205 is an anode region. Second region 206 is a cathode region.

Figure 3B:
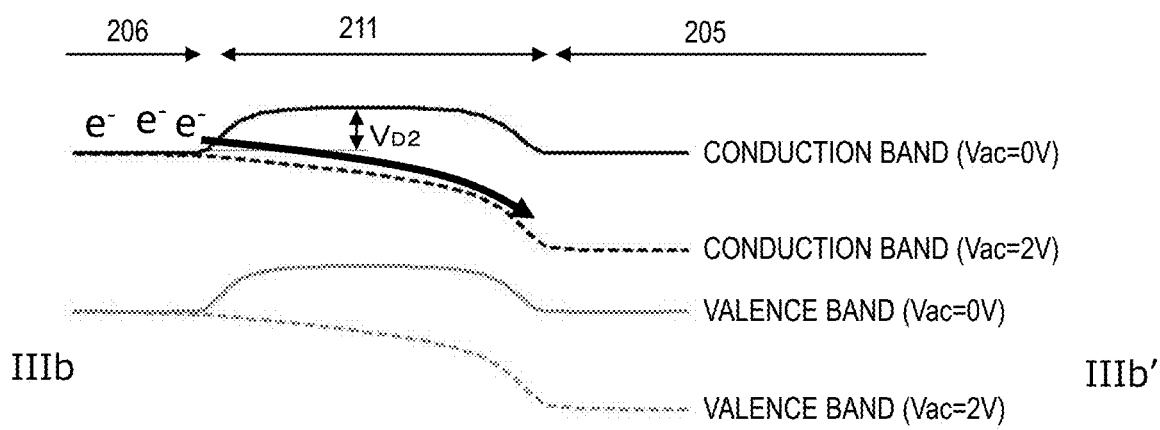
FIG. 3B is a schematic view that illustrates energy band structures in the temperature sensor.
Figure 3C:
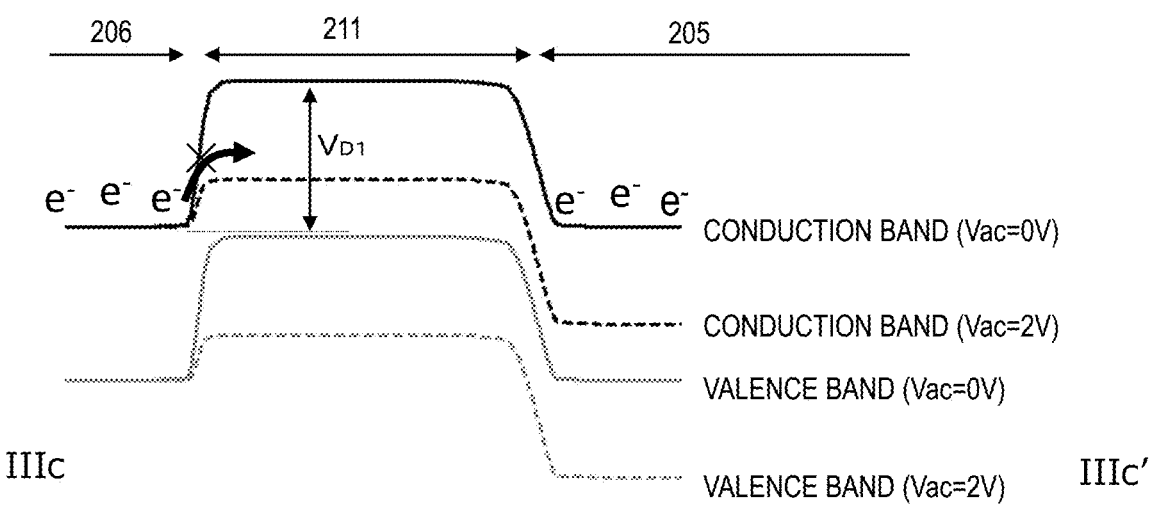
FIG. 3C is a schematic view that illustrates energy band structures in the temperature sensor.

FIG. 3B is a schematic view that illustrates energy band structures in temperature-sensing conductive layer 208 along line IIIb-IIIb' in FIG. 3A. FIG. 3C is a schematic view that illustrates energy band structures of second region 206, third region 211, and first region 205 along line IIIc-IIIc' in FIG. 3A. In FIGS. 3B and 3C, a band structure before application of anode-to-cathode voltage Vac is represented by a solid line. Further, a band structure at a time when voltage Vac of 2 V is applied between the anode and the cathode is represented by a broken line. Suppose that built-in potential $V_{D1}$ that corresponds to conduction band offset between second region 206 and third region 211 is 3 V.

As represented by a solid line in FIG. 3C, an energy barrier (a difference in electric potential: $V_{D1}$) exists at a junction between second region 206 of n-type and third region 211 of p-type in temperature sensor 32. Built-in potential $V_{D1}$ composes the energy barrier. On the other hand, an energy barrier exists in temperature-sensing conductive layer 208 on the junction between second region 206 and third region 211, as represented by a solid line in FIG. 3B. Due to influence of third region 211, the energy barrier in temperature-sensing conductive layer 208 exists, and the energy barrier in temperature-sensing conductive layer 208 has a potential difference $V_{D2}$ that is smaller than built-in potential $V_{D1}$.

If voltage Vac (e.g., 2 V) that is lower than built-in potential $V_{D1}$ is applied between an anode and a cathode, the energy barrier at the junction between second region 206 and third region 211 becomes low but does not disappear, as represented by a broken line in FIG. 3C. On the other hand, the energy barrier disappears in temperature-sensing conductive layer 208, as represented by a broken line in FIG. 3B. Therefore, it is thought that most electrons in second region 206 are not injected into third region 211, but flow from second region 206 through temperature-sensing conductive layer 208 to first region 205.

As described above, in temperature sensor 32, electrons are not injected from second region 206 to third region 211, or sensing-body region 203. Therefore, operation of a parasitic bipolar junction transistor that includes second region 206, sensing-body region 203, and drift region 102 is restricted.

In the present exemplary embodiment, voltage Vac applied between an anode and a cathode only needs to be higher than or equal to potential difference $V_{D2}$ of an energy barrier in temperature-sensing conductive layer 208. Therefore, voltage Vac applied between an anode and a cathode is lower than built-in potential $V_{D1}$. Accordingly, electric power (electric current×voltage) consumed by temperature sensor 32 to sense a temperature is reduced. Therefore, heat generated by temperature sensor 32 is reduced, and thus a temperature continues to be accurately sensed.

Figure 4A:
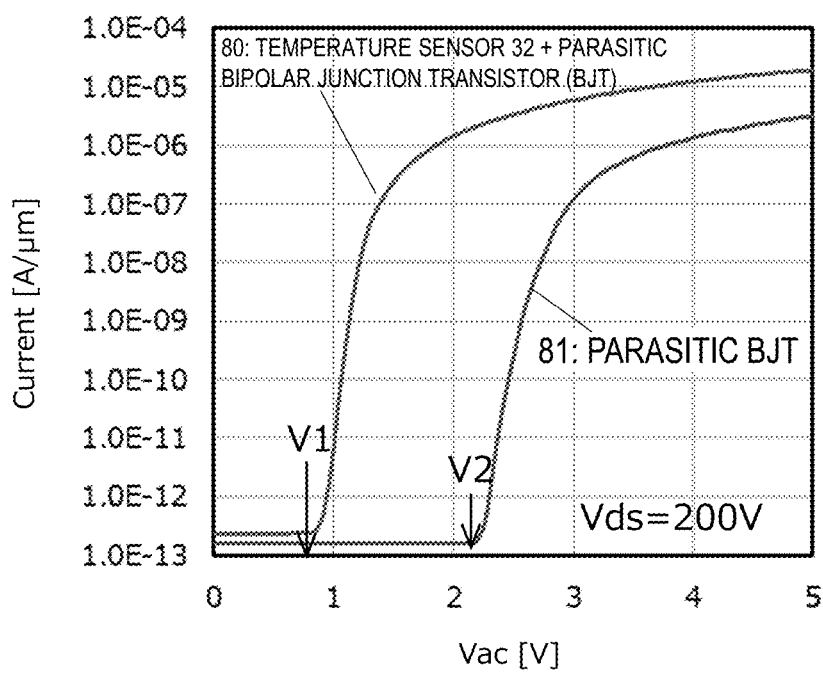
FIG. 4A is a graph that illustrates a relationship between anode-to-cathode voltage Vac and electric current in the semiconductor device according to the exemplary embodiment.
Figure 4B:
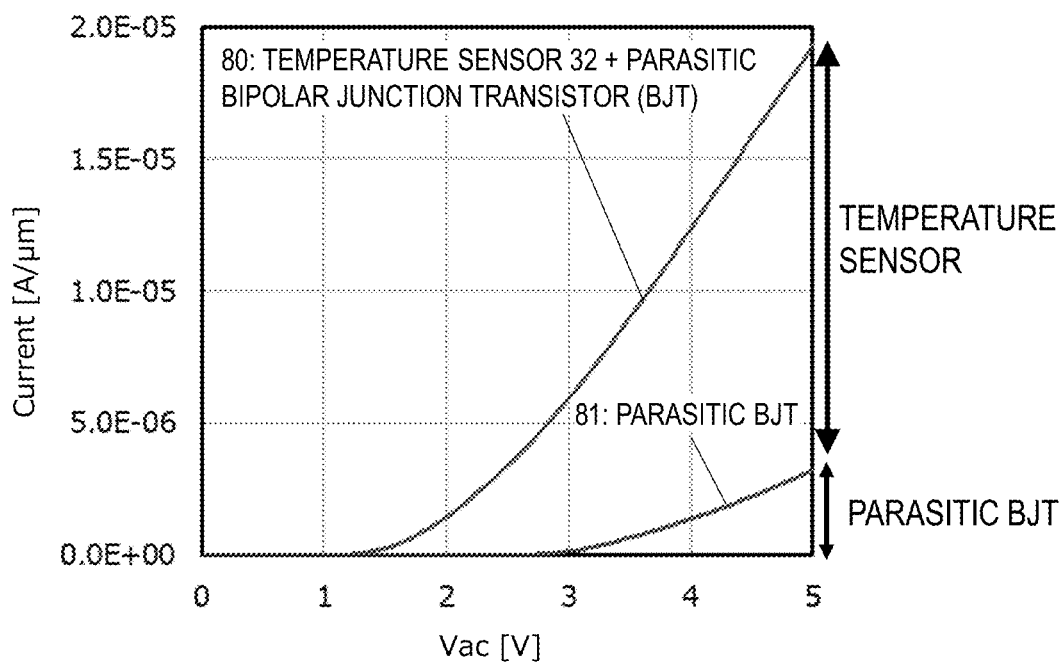
FIG. 4B is a graph that illustrates a relationship between anode-to-cathode voltage Vac and electric current in the semiconductor device according to the exemplary embodiment.

FIGS. 4A and 4B are graphs that each illustrate a relationship between anode-to-cathode voltage Vac and electric current in semiconductor device 1000 according to the present exemplary embodiment. In a simulation, drain-to-source voltage Vds is 200 V.

In FIGS. 4A and 4B, a horizontal axis represents anode-to-cathode voltage Vac, and a vertical axis represents electric current. Line 80 represents electric current that flows from a cathode electrode. Line 81 represents electric current that flows into a drain electrode. FIG. 4A uses a logarithmic scale for a vertical axis. FIG. 4B uses a linear scale for a vertical axis. However, FIGS. 4A and 4B illustrate a same result.

As illustrated in FIGS. 4A and 4B, turn-on voltage V1 of temperature sensor 32 is sufficiently lower than turn-on voltage V2 of a parasitic bipolar junction transistor since semiconductor device 1000 according to the present exemplary embodiment includes temperature-sensing conductive layer 208 of an n⁺ type. Therefore, anode-to-cathode voltage Vac can be controlled to reduce electric current that flows through the parasitic bipolar junction transistor, and to make a predetermined electric current flow through temperature sensor 32.

Anode-to-cathode voltage Vac may be set at a voltage that is higher than or equal to turn-on voltage V1 of temperature sensor 32, e.g., approximately 1.5 V or higher. On the other hand, if anode-to-cathode voltage Vac is lower than built-in potential $V_{D1}$ (3 V in this case), electric current hardly flows through the parasitic bipolar junction transistor. Therefore, anode-to-cathode voltage Vac is set at a voltage that is lower than built-in potential $V_{D1}$, for example, to effectively restrict operation of the parasitic bipolar junction transistor, and thus make electric current selectively flow through only temperature sensor 32.

The results show that the present exemplary embodiment allows temperature sensor 32 to more accurately sense a junction temperature of semiconductor device 1000. Further, it is confirmed that anode-to-cathode voltage Vac used for operation of temperature sensor 32 is lower than conventional anode-to-cathode voltage Vac used for operation of temperature sensor 32.

Configurations of Temperature-Sensing Conductive Layer 208 and Separation Assisting Layer 308

Next, a result of study of configurations of temperature-sensing conductive layer 208 and separation assisting layer 308 by the present inventors will be described. In the description, the first conductivity type is n-type and the second conductivity type is p-type, for example. However, the first conductivity type may be p-type and the second conductivity type may be n-type.

The present inventors used a device simulator to study a distribution of electron electric-current densities in temperature sensor 32 and separating portion 33, and thus determined a relationship between configurations of temperature-sensing conductive layer 208 and separation assisting layer 308 and leakage current.

Figure 5A:
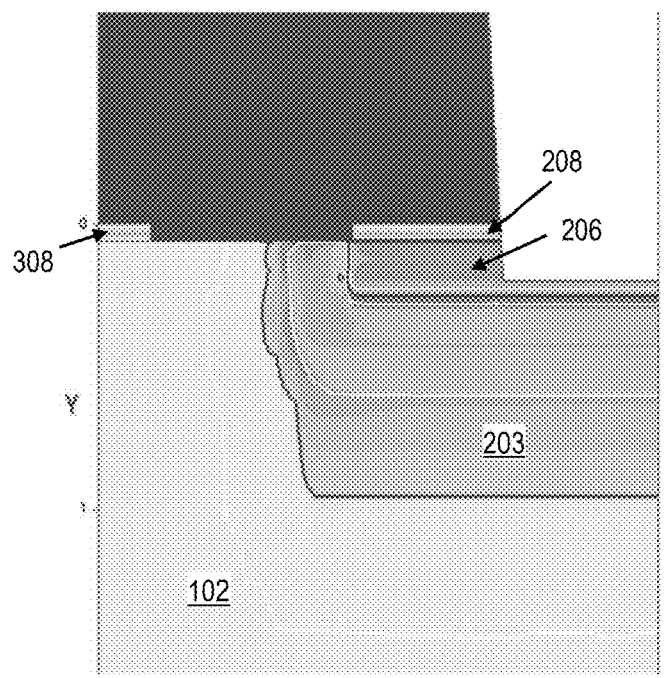
FIG. 5A is a diagram that illustrates a distribution of hole current densities in the temperature sensor and the separating portion in a case where a temperature-sensing conductive layer is separated from a separation assisting layer.
Figure 5B:
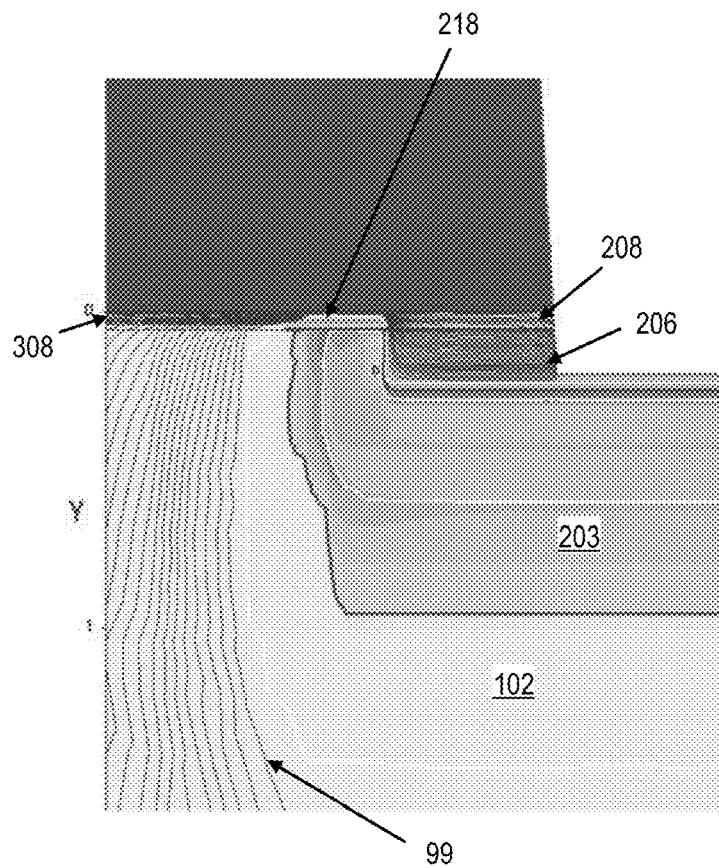
FIG. 5B is a diagram that illustrates a distribution of hole current densities in the temperature sensor and the separating portion in a case where a temperature-sensing conductive layer connects with a separation assisting layer.

FIG. 5A is a cross-sectional view that illustrates a distribution of hole current densities in temperature sensor 32 and separating portion 33 in a case where temperature-sensing conductive layer 208 is separated from separation assisting layer 308. FIG. 5B is a cross-sectional view that illustrates a distribution of hole current densities in temperature sensor 32 and separating portion 33 in a case where temperature-sensing conductive layer 208 connects with separation assisting layer 308. In performed simulation, voltage Vc applied to second region 206 serving as a cathode region was set at 0 V, voltage Va applied to a first region (not illustrated) serving as an anode region was set at 1 V, and drain-to-source voltage Vds was set at 10 V. Voltage Vbd applied to sensing-body region 203 was equal to voltage Va (=1 V) applied to the anode region.

If temperature-sensing conductive layer 208 connects with separation assisting layer 308, as illustrated in FIG. 5B, and positive voltage Vbd is applied to sensing-body region 203, a back-gate effect forms layer 218 of electrons on part of a surface of temperature-sensing conductive layer 208. The part of the surface of temperature-sensing conductive layer 208 is on sensing-body region 203. Therefore, electrons in second region 206 move to part of separation assisting layer 308 through temperature-sensing conductive layer 208. The part of separation assisting layer 308 is on drift region 102. Consequently, electrons may be injected into drift region 102. Consequently, leakage current 99 may occur.

On the other hand, if temperature-sensing conductive layer 208 is separated from separation assisting layer 308, as illustrated in FIG. 5A, and positive voltage Vbd is applied to sensing-body region 203, an energy barrier hinders electrons in temperature-sensing conductive layer 208 from moving to sensing-body region 203. Therefore, second region 206 is not electrically connected with drift region 102. Therefore, leakage current illustrated in FIG. 5B is not likely to occur.

From the above results, it is confirmed that preferably, temperature-sensing conductive layer 208 is electrically separated from separation assisting layer 308.

Method for Manufacturing Semiconductor Device 1000

Next, an example of methods for manufacturing semiconductor device 1000 will be described with reference to FIGS. 6A to 6K. In the description below, the first conductivity type is n-type and the second conductivity type is p-type. However, the first conductivity type may be p-type and the second conductivity type may be n-type. Materials and thicknesses of the layers, and kinds and concentrations of the impurities are exemplified.

Figure 6A:
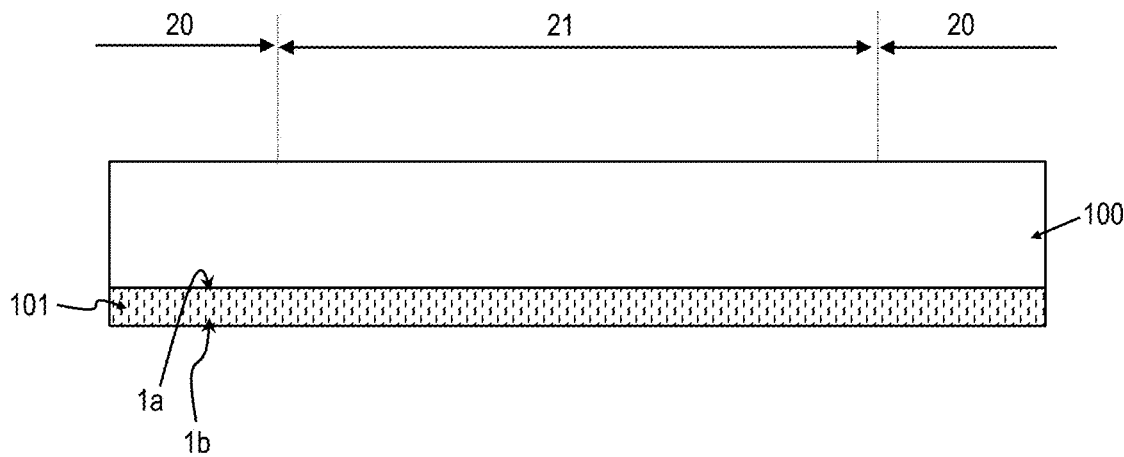
FIG. 6A is a cross-sectional view in a step that illustrates an example of a method for manufacturing the semiconductor device.

First, semiconductor substrate 101 of n-type is prepared as illustrated in FIG. 6A. Next, first silicon carbide semiconductor layer 100 of n-type is formed by epitaxy, for example, on main side 1a of semiconductor substrate 101.

For example, an off-cut substrate whose 4H—SiC (0001) surface is oriented 4° off toward a [11-20] direction is used for semiconductor substrate 101. A concentration of an n-type impurity in semiconductor substrate 101 is approximately $1 \times 10^{19}$ cm⁻³, for example. First silicon carbide semiconductor layer 100 is made of 4H—SiC, for example. A concentration of an n-type impurity in first silicon carbide semiconductor layer 100 is lower than the concentration of an n-type impurity in semiconductor substrate 101. The concentration of an n-type impurity in first silicon carbide semiconductor layer 100, that is to say a concentration of an n-type impurity in a drift region ranges from $1 \times 10^{14}$ cm⁻³ to $1 \times 10^{17}$ cm⁻³ inclusive, for example. A thickness of first silicon carbide semiconductor layer 100 is approximately 10 μm, for example.

Figure 6B:
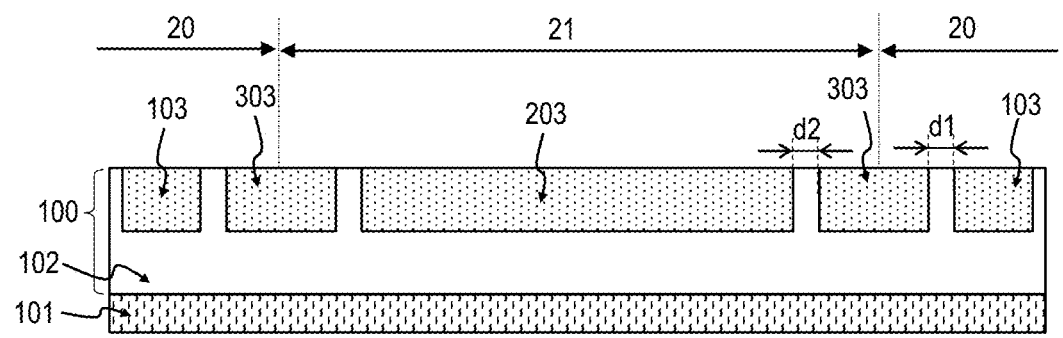
FIG. 6B is a cross-sectional view in a step that illustrates an example of the method for manufacturing the semiconductor device.

Next, a mask (not illustrated) is formed on first silicon carbide semiconductor layer 100. Then p-type impurity ions (e.g., aluminum (Al) ions or boron (B) ions) are implanted into first silicon carbide semiconductor layer 100, as illustrated in FIG. 6B. Consequently, main-body regions 103 are formed in main area 20. Further, sensing-body region 203, separating-body region 303, and the under-wiring body region (not illustrated) are formed in temperature sensing area 21. For example, separating-body region 303 may be formed between sensing-body region 203 and main-body regions 103 in such a manner that separating-body region 303 surrounds sensing-body region 203. The under-wiring body region may be formed in such a manner that the under-wiring body region connects with separating-body region 303.

A width of separating-body region 303 is 30 μm, for example. The width of separating-body region 303 may be wider than or equal to a width of main-body regions 103. Separating-body region 303 only needs to have a function that electrically separates temperature sensor 32 from unit cells 31 in main area 20. Preferably, the width of separating-body region 303 is as narrow as possible within a range within which separating-body region 303 has the function. A distance between main-body regions 103 that are adjacent to each other, distance d1 between separating-body region 303 and main-body regions 103, or distance d2 between separating-body region 303 and sensing-body region 203 each range from 0.5 µm to 3.0 µm inclusive, for example.

Main-body regions 103, sensing-body region 203, separating-body region 303, and the under-wiring body region have an equal concentration profile of a p-type impurity in depth directions of main-body regions 103, sensing-body region 203, separating-body region 303, and the under-wiring body region if main-body regions 103, sensing-body region 203, separating-body region 303, and the under-wiring body region are formed simultaneously. A concentration of a doped p-type impurity ranges from $1 \times 10^{17}$ cm$^{-3}$ to $1 \times 10^{20}$ cm$^{-3}$ inclusive, for example. A depth of main-body regions 103, sensing-body region 203, separating-body region 303, and the under-wiring body region is approximately 0.8 µm, for example. A field limited ring (FLR) not illustrated may be formed at an end area of semiconductor device 1000 simultaneously with formation of main-body regions 103, sensing-body region 203, separating-body region 303, and the under-wiring body region. Main-body regions 103, sensing-body region 203, separating-body region 303, and the under-wiring body region may be separately formed. If main-body regions 103, sensing-body region 203, separating-body region 303, and the under-wiring body region are separately formed, main-body regions 103, sensing-body region 203, separating-body region 303, and the under-wiring body region have respective concentrations of a p-type dopant, and depths.

Figure 6C:
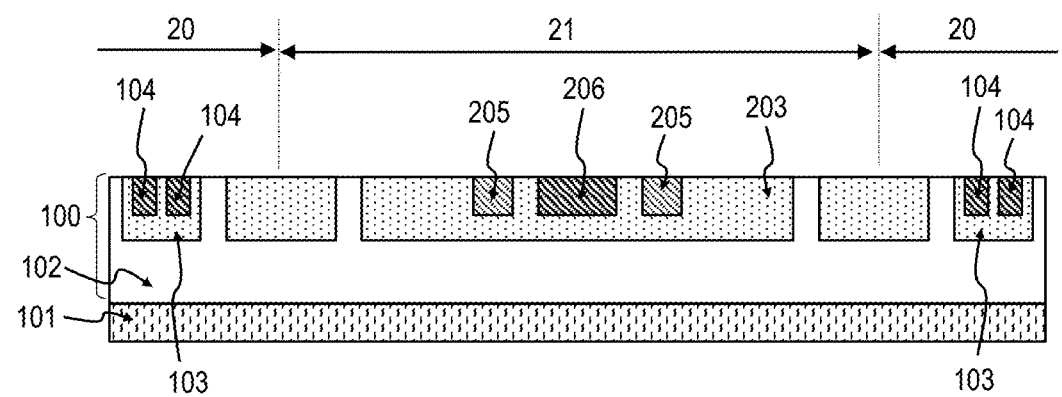
FIG. 6C is a cross-sectional view in a step that illustrates an example of the method for manufacturing the semiconductor device.

Next, n-type impurity ions (e.g., nitrogen ions) are implanted into part of main-body regions 103 and part of sensing-body region 203, as illustrated in FIG. 6C. A mask (not illustrated) is used for the implantation. Consequently, source regions 104 are formed in each main-body region 103. Further, first region (an anode region in this case) 205 and second region (a cathode region in this case) 206 are formed in sensing-body region 203. First region 205 and second region 206 are arranged apart from each other. A distance between first region 205 and second region 206 may range from 0.5 µm to 3.0 µm inclusive, for example. A concentration of an n-type impurity doped in source regions 104, first region 205, and second region 206 ranges from $1 \times 10^{18}$ cm$^{-3}$ to $1 \times 10^{21}$ cm$^{-3}$ inclusive, for example.

First region 205 is formed in such a manner that first region 205 surrounds second region 206 when first region 205 is seen in a direction perpendicular to semiconductor substrate 101 (see FIG. 2B). Therefore, first region 205 is at both sides of second region 206 in any cross section that is perpendicular to semiconductor substrate 101. First region 205 may be disposed on only one side of second region 206.

Figure 6D:
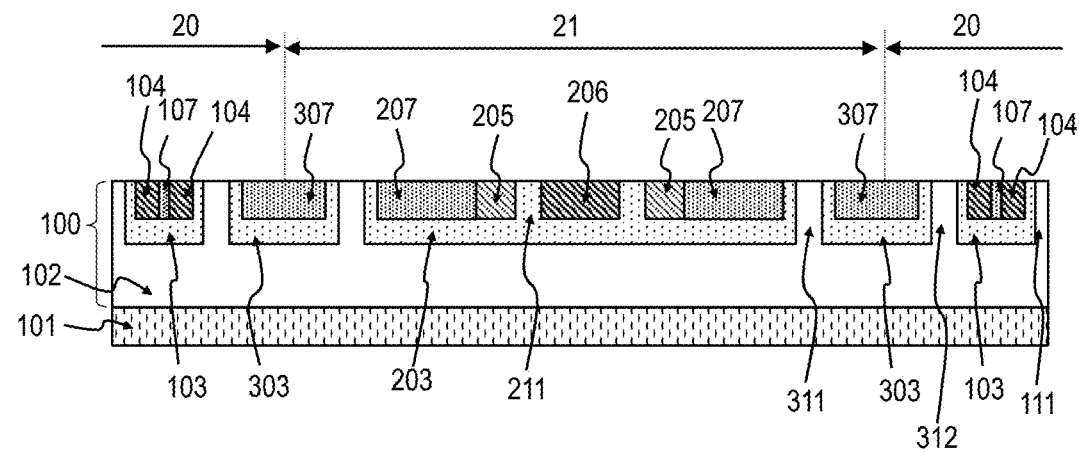
FIG. 6D is a cross-sectional view in a step that illustrates an example of the method for manufacturing the semiconductor device.

As illustrated in FIG. 6D, p-type impurity ions (e.g., Al ions) are implanted into main-body regions 103, sensing-body region 203, and separating-body region 303, as illustrated in FIG. 6D. A mask (not illustrated) is used for the implantation. Consequently, main-body contact area 107 is formed in each main-body region 103. Sensing-body contact region 207 is formed in sensing-body region 203. Separating-body contact area 307 is formed in separating-body region 303. Further, a under-wiring contact region is formed in the under-wiring body region. However, the under-wiring contact region is not illustrated. The under-wiring contact region may be formed in such a manner that the under-wiring contact region connects with separating-body contact area 307. A concentration of a p-type impurity doped in main-body contact areas 107, sensing-body contact region 207, separating-body contact area 307, and the under-wiring contact region ranges from $1 \times 10^{19}$ cm$^{-3}$ to $1 \times 10^{21}$ cm$^{-3}$ inclusive, for example. A depth of main-body contact areas 107, sensing-body contact region 207, separating-body contact area 307, and the under-wiring contact region is approximately 400 nm, for example.

Preferably, sensing-body contact region 207 is not disposed in third region 211 that is between first region 205 and second region 206. A reason is that a concentration of a p-type impurity in sensing-body contact region 207 is higher than a concentration of a p-type impurity in third region 211. Therefore, an energy barrier in temperature-sensing conductive layer 208 illustrated in FIG. 3B becomes high, and thus a potential difference $V_{D2}$ becomes large. If potential difference $V_{D2}$ becomes large, a difference between built-in potential $V_{D1}$ and potential difference $V_{D2}$ becomes small. Therefore, electrons that are injected into sensing-body region 203 from second region 206 increase. Therefore, a parasitic bipolar junction transistor that includes second region 206, sensing-body region 203, and drift region 102 may operate.

Figure 7:
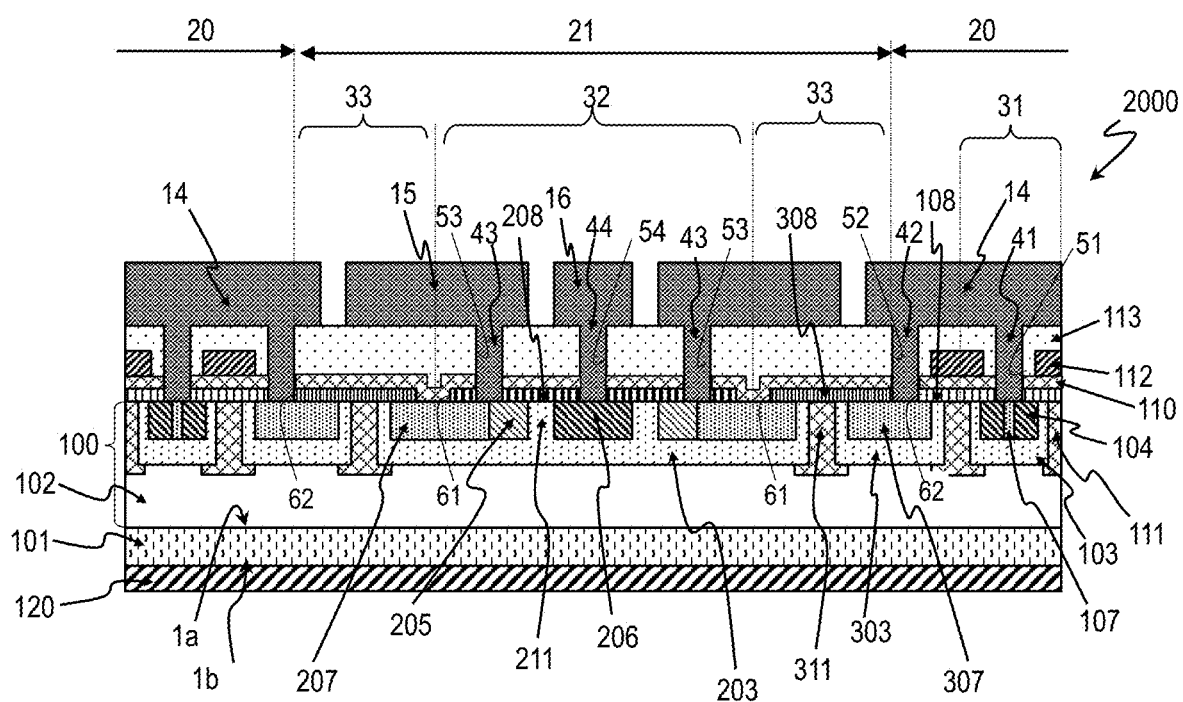
FIG. 7 is a cross-sectional view that exemplifies another semiconductor device according to the exemplary embodiment.

In main area 20 and temperature sensing area 21, n-type impurity ions (e.g., nitrogen ions) may be implanted into JFET regions 111 that are each between main-body regions 103 that are adjacent to each other in first silicon carbide semiconductor layer 100 (see FIG. 7). Further, n-type impurity ions (e.g., nitrogen ions) may be implanted into fourth region 311 that is between separating-body region 303 and sensing-body region 203 (see FIG. 7). Further, n-type impurity ions (e.g., nitrogen ions) may be implanted into fifth area 312 that is between separating-body region 303 and main-body regions 103 (see FIG. 7). However, the implantation of n-type impurity ions is not illustrated. In that case, JFET regions 111, fourth region 311, and fifth area 312 have an equal concentration profile of an n-type impurity in depth directions of JFET regions 111, fourth region 311, and fifth area 312. A concentration of an n-type impurity doped in JFET regions 111, fourth region 311, and fifth area 312 ranges from $1 \times 10^{16}$ cm$^{-3}$ to $1 \times 10^{18}$ cm$^{-3}$ inclusive, for example. A depth of JFET regions 111, third region 211, and fourth region 311 may be deeper than a depth of main-body regions 103, sensing-body region 203, and separating-body region 303.

Drift region 102 is a region of first silicon carbide semiconductor layer 100 where main-body regions 103, source regions 104, main-body contact areas 107, sensing-body region 203, sensing-body contact region 207, separating-body region 303, separating-body contact area 307, the under-wiring body region (not illustrated), and the under-wiring contact region (not illustrated) are not formed.

An order of the impurity implantations illustrated in FIGS. 6B to 6D is not particularly limited. After the impurity implantations, annealing for activation is performed. The annealing for activation is performed at a temperature of approximately 1700° C. in an inert atmosphere for approximately 30 minutes.

Figure 6E:
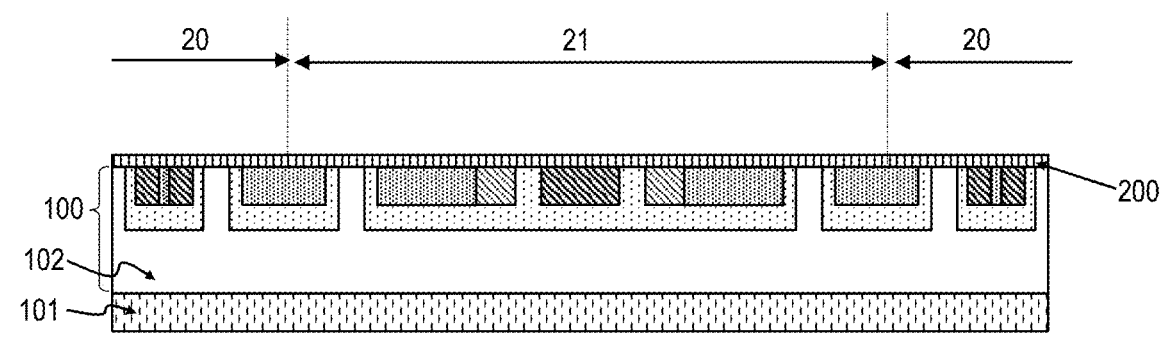
FIG. 6E is a cross-sectional view in a step that illustrates an example of the method for manufacturing the semiconductor device.

Next, second silicon carbide semiconductor layer 200 is formed on first silicon carbide semiconductor layer 100, as illustrated in FIG. 6E. A concentration of a first conductivity type impurity in second silicon carbide semiconductor layer 200 is higher than a concentration of a first conductivity type impurity in drift region 102. A concentration of an n-type impurity in second silicon carbide semiconductor layer 200 may be higher than a concentration of an n-type impurity in drift region 102, and may be lower than a concentration of an n-type impurity in first region 205 and second region 206. The concentration of an n-type impurity in second silicon carbide semiconductor layer 200 ranges from $1 \times 10^{17}$ cm$^{-3}$ to $1 \times 10^{19}$ cm$^{-3}$ inclusive, for example. A thickness of second silicon carbide semiconductor layer 200 ranges from 20 nm to 200 nm inclusive, for example.

Second silicon carbide semiconductor layer 200 is formed by epitaxy, for example. Methods for forming second silicon carbide semiconductor layer 200 are not particularly limited. On a surface layer of first silicon carbide semiconductor layer 100, second silicon carbide semiconductor layer 200 may be formed by ion implantation, for example. Second silicon carbide semiconductor layer 200 may include one n-type layer, or may include stacked layers.

Figure 6F:
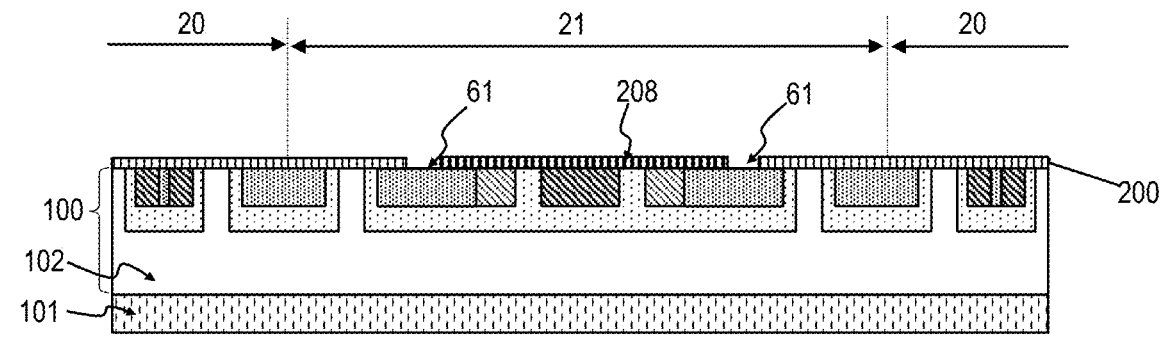
FIG. 6F is a cross-sectional view in a step that illustrates an example of the method for manufacturing the semiconductor device.

Next, second silicon carbide semiconductor layer 200 is patterned to form third opening 61, as illustrated in FIG. 6F. Third opening 61 separates part of second silicon carbide semiconductor layer 200 that will become temperature-sensing conductive layer 208 from the other part of second silicon carbide semiconductor layer 200 (part that will become separation assisting layer 308 and channel layer 108 in this case). Consequently, temperature-sensing conductive layer 208 that has a shape like an island is formed.

In the patterning, fourth opening 62 may also be formed although fourth opening 62 is not illustrated. Fourth opening 62 separates part that will become separation assisting layer 308 from part that will become channel layer 108. In the present exemplary embodiment, after separating-body contact opening 52 is formed through interlayer dielectric 113 and gate insulating film 110, fourth opening 62 is formed when a nickel-silicide layer that will be described later is formed in separating-body contact opening 52.

A width of third opening 61 is not particularly limited but may range from 1 μm to 10 μm inclusive, for example. A width of fourth opening 62 is not particularly limited but may be equal to a width of source contact opening 51, for example.

Figure 6G:
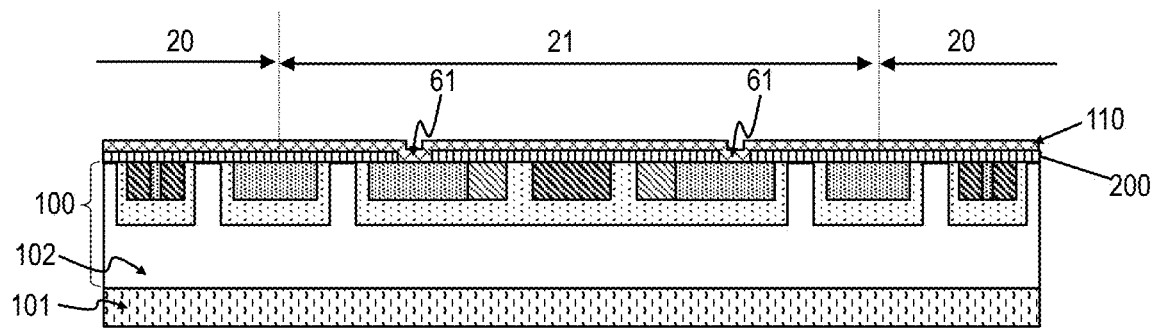
FIG. 6G is a cross-sectional view in a step that illustrates an example of the method for manufacturing the semiconductor device.

Next, as illustrated in FIG. 6G, gate insulating film 110 is formed on a surface of second silicon carbide semiconductor layer 200. Gate insulating film 110 may be formed on second silicon carbide semiconductor layer 200 by thermal oxidation, for example. A thickness of gate insulating film 110 is approximately 70 nm, for example.

Figure 6H:
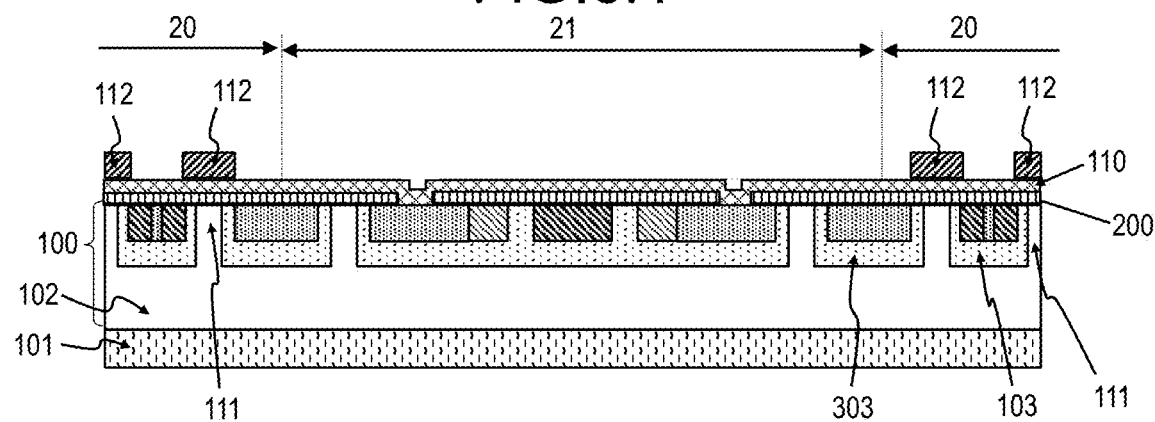
FIG. 6H is a cross-sectional view in a step that illustrates an example of the method for manufacturing the semiconductor device.

Then a conductive-film-for-gate is formed on a surface of gate insulating film 110, and the conductive-film-for-gate is patterned, as illustrated in FIG. 6H. Consequently, gate electrodes 112 are formed. For example, a polycrystalline silicon film (not illustrated) in which approximately $7 \times 10^{20}$ cm$^{-3}$ of phosphorus is doped may be used as the conductive-film-for-gate. A thickness of the polycrystalline silicon film is approximately 500 nm, for example. A plurality of openings are formed through the conductive-film-for-gate to form a gate layer that includes gate electrodes 112 of unit cells 31. The openings are arranged in such a manner that each of the openings overlaps at least part of source region 104, main-body region 103, and at least part of JFET area 111 of each of unit cells 31 when the openings are seen in a direction perpendicular to semiconductor substrate 101.

Figure 6I:
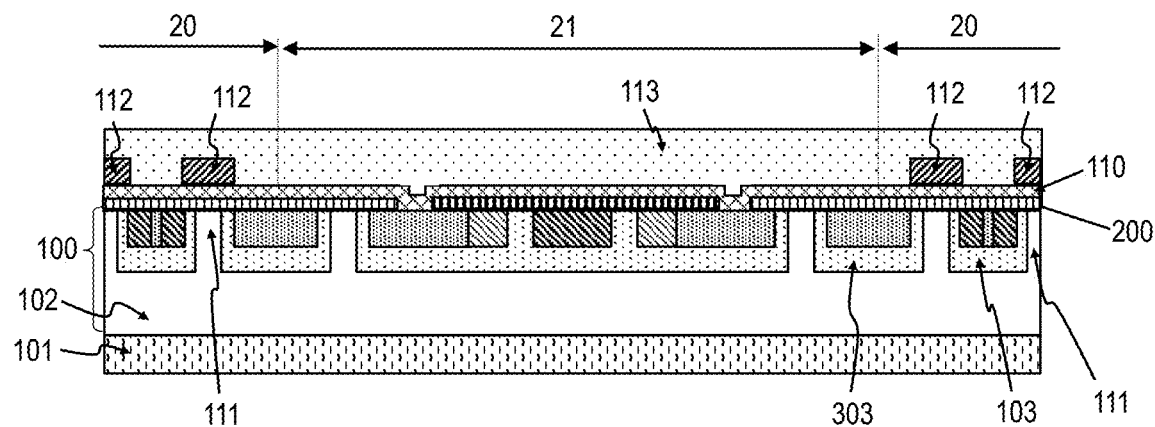
FIG. 6I is a cross-sectional view in a step that illustrates an example of the method for manufacturing the semiconductor device.

Next, as illustrated in FIG. 6I, interlayer dielectric 113 is formed in such a manner that interlayer dielectric 113 covers surfaces of gate electrodes 112, and a surface of gate insulating film 110. Interlayer dielectric 113 may be an SiO$_2$ film formed by chemical vapor deposition (CVD), for example. A thickness of interlayer dielectric 113 is 1.5 μm, for example.

Figure 6J:
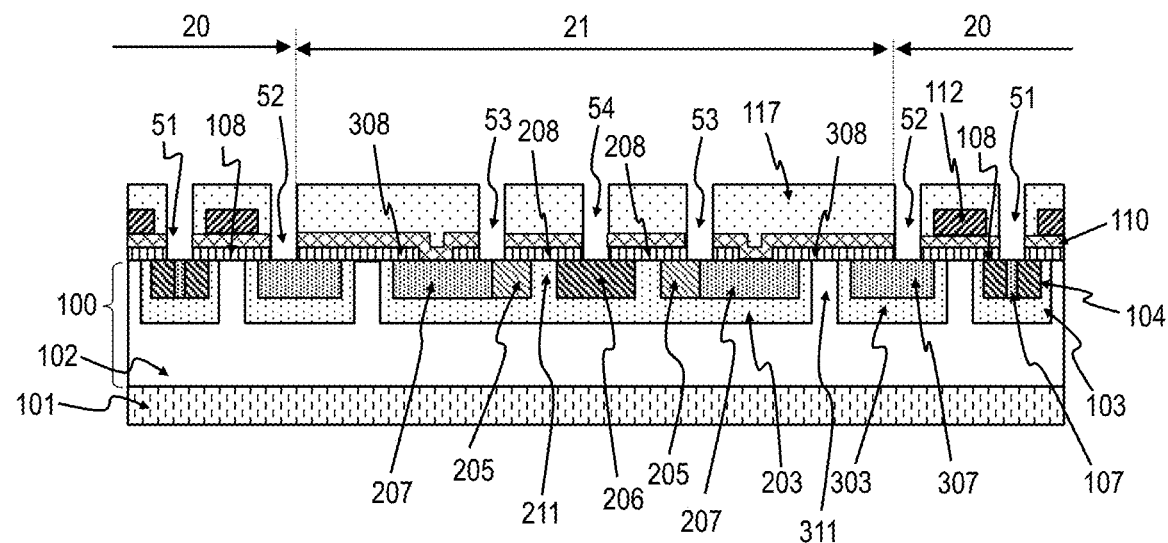
FIG. 6J is a cross-sectional view in a step that illustrates an example of the method for manufacturing the semiconductor device.

Then, as illustrated in FIG. 6J, interlayer dielectric 113 and gate insulating film 110 are patterned by dry etching that uses a mask (not illustrated). Source contact opening 51 is formed through part of interlayer dielectric 113 that is over part of main-body contact area 107 and part of source region 104 of each of unit cells 31. Separating-body contact opening 52 is formed through part of interlayer dielectric 113 that is over part of separating-body contact area 307. First opening 53 is formed through part of interlayer dielectric 113 that is over part of sensing-body contact region 207 and part of first region 205. Second opening 54 is formed through part of interlayer dielectric 113 that is over part of second region 206. An opening-under-wiring not illustrated is formed through part of interlayer dielectric 113 that is over part of the under-wiring contact region.

Figure 6K:
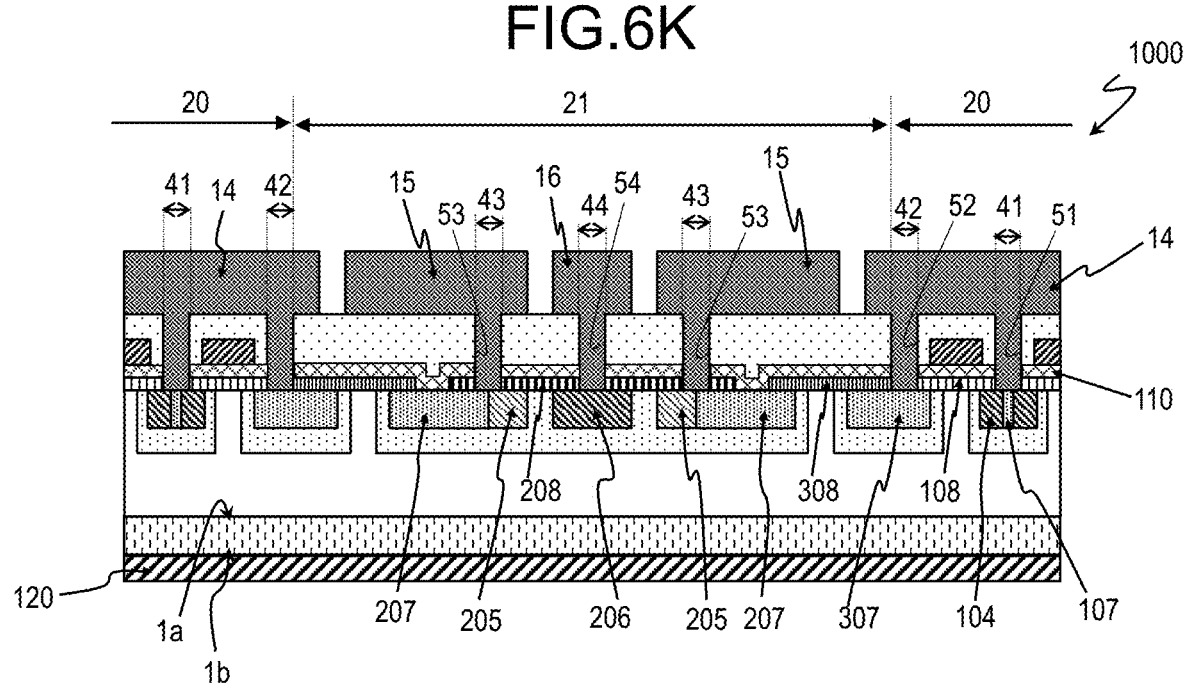
FIG. 6K is a cross-sectional view in a step that illustrates an example of the method for manufacturing the semiconductor device.

Next, as illustrated in FIG. 6K, source electrode 14 is formed in source contact openings 51 and is in contact with source regions 104 and main-body contact areas 107. Further, source electrode 14 is formed in separating-body contact opening 52 and is in contact with separating-body contact area 307. Further, source electrode 14 is formed in the opening-under-wiring and is in contact with the under-wiring contact region. Further, first electrode (an anode electrode in this case) 15 is formed in first opening 53 and is in contact with first region 205 and sensing-body contact region 207. Further, second electrode (a cathode electrode in this case) 16 is formed in second opening 54 and is in contact with second region 206. Drain electrode 120 is formed on back side 1b of semiconductor substrate 101. These electrodes are formed as described below, for example.

First, a nickel film is formed on interlayer dielectric 113, and in openings 51, 52, 53, 54, and in the opening-under-wiring. A thickness of the nickel film ranges from approximately 50 nm to 100 nm, for example. Etching removes the nickel film but leaves part of the nickel film in openings 51, 52, 53, 54, and in the opening-under-wiring. Next, the left nickel film receives heat treatment at 950° C. in an inert atmosphere for 5 minutes, for example. Consequently, nickel reacts with a surface of silicon carbide. Consequently, a nickel-silicide layer is formed in openings 51, 52, 53, 54, and in the opening-under-wiring. Ohmic contacts are formed between the nickel-silicide layer in source contact openings 51 and source regions 104, and between the nickel-silicide layer in source contact openings 51 and main-body contact areas 107. Similarly, an ohmic contact is formed between the nickel-silicide layer in separating-body contact opening 52 and separating-body contact area 307. Further, an ohmic contact is formed between the nickel-silicide layer in first opening 53 and first region 205, and between the nickel-silicide layer in first opening 53 and sensing-body contact region 207. Further, an ohmic contact is formed between the nickel-silicide layer in second opening 54 and second region 206. Further, an ohmic contact is formed between the nickel-silicide layer in the opening-under-wiring and the under-wiring contact region. However, the opening-under-wiring and the under-wiring contact region are not illustrated.

Titanium is deposited on back side 1b of semiconductor substrate 101. A thickness of the deposited titanium is approximately 150 nm, The deposited titanium receives similar heat treatment. Consequently, the titanium reacts with a surface of silicon carbide. Consequently, a titanium-silicide layer is formed. An ohmic contact is formed between the titanium-silicide layer and semiconductor substrate 101.

Next, an upper wiring film is formed on interlayer dielectric 113, and in openings 51, 52, 53, 54, and in the opening-under-wiring in such a manner that the upper wiring film is in contact with the nickel-silicide layer. For example, an aluminum film that has a thickness of approximately 4 μm, for example, is deposited as the upper wiring film. Then the upper wiring film is etched to form source electrode 14, first electrode 15, and second electrode 16. On the titanium-silicide layer on back side 1b of semiconductor substrate 101, for example, titanium (Ti), nickel (Ni), and silver (Ag) are deposited in this order to form drain electrode 120. As described above, semiconductor device 1000 is manufactured.

Another Example of Semiconductor Device

The semiconductor device according to the present exemplary embodiment may not include separation assisting layer 308 at separating portion 33. Further, the semiconductor device according to the present exemplary embodiment may not include channel layer 108 at main area 20. In that case, in each of unit cells 31, gate insulating film 110 is disposed in such a manner that gate insulating film 110 is in contact with the surface of first silicon carbide semiconductor layer 100. If a positive voltage is applied to gate electrode 112, electrons are induced near an interface between part of main-body region 103 and part of gate insulating film 110. The part of main-body region 103 and the part of gate insulating film 110 are between source region 104 and the JFET area. Consequently, inversion occurs near the interface, and thus an inversion layer is formed near the interface (inversion channel structure).

To form the above structure, part of second silicon carbide semiconductor layer 200 that is at main area 20 or separating portion 33 is removed when second silicon carbide semiconductor layer 200 is patterned.

FIG. 7 is a cross-sectional view that exemplifies another semiconductor device 2000 according to the present exemplary embodiment.

Semiconductor device 2000 is different from semiconductor device 1000 since a concentration of a first conductivity type impurity in JFET regions 111 and fourth region 311 is higher than a concentration of a first conductivity type impurity in drift region 102. To form JFET regions 111 and fourth region 311, a first conductivity type impurity is implanted into first silicon carbide semiconductor layer 100 by one ion-implantation.

In addition to the silicon carbide semiconductor, the semiconductor device according to the present disclosure may be a semiconductor device that includes another wide-bandgap semiconductor, such as gallium nitride (GaN), gallium oxide ($Ga_2O_3$), or diamond. Alternatively, the semiconductor device according to the present disclosure may be a silicon semiconductor device that includes a silicon semiconductor.

The semiconductor device according to the present disclosure is not limited to a vertical MISFET, but may be another semiconductor device. The semiconductor device according to the present disclosure may be a junction field effect transistor (JFET), or an insulated gate bipolar transistor (IGBT) that includes a silicon carbide wafer of a conductivity type that is different from a conductivity type of first silicon carbide semiconductor layer 100.

A technique disclosed in the present description is useful for, for example, use of a semiconductor device used for a power converter. A technique disclosed in the present description is especially useful for use of a power semiconductor device installed in a power converter for a vehicle or industrial equipment.

What is claimed is:
1. A semiconductor device comprising:
a semiconductor substrate of a first conductivity type;
a first semiconductor layer that is on a main side of the semiconductor substrate, and includes a main area and a temperature sensing area on the main side;
a plurality of unit cells arranged in the main area and connected with each other in parallel; and
a temperature sensor disposed in the temperature sensing area, wherein
each of the plurality of unit cells includes:
a main-body region of a second conductivity type that is disposed in the first semiconductor layer, and is in contact with a surface of the first semiconductor layer;
a source region of the first conductivity type that is in the main-body region;
a drift region of the first conductivity type disposed in a region of the first semiconductor layer except the main-body region and the source region;
a gate insulating film disposed on the first semiconductor layer;
a gate electrode disposed on the gate insulating film;
a source electrode disposed on the first semiconductor layer, and electrically connected with the source region; and
a drain electrode disposed on a back side of the semiconductor substrate,
the temperature sensor includes:
a sensing-body region of the second conductivity type that is disposed in the first semiconductor layer, and is in contact with the surface of the first semiconductor layer;
a first region of the first conductivity type, and a second region of the first conductivity type that are arranged in the sensing-body region and are apart from each other;
a third region of the second conductivity type that is in the sensing-body region and is between the first region and the second region;
a temperature-sensing conductive layer of the first conductivity type that is disposed on the first semiconductor layer, and is in contact with part of the first region, the third region, and part of the second region;
a first electrode electrically connected with the first region and the sensing-body region; and
a second electrode electrically connected with the second region, and
a concentration of an impurity of the first conductivity type in the temperature-sensing conductive layer is higher than a concentration of an impurity of the first conductivity type in the drift region.
2. The semiconductor device according to claim 1, wherein
the temperature sensing area further includes a separating portion that electrically separates the temperature sensor from the plurality of unit cells in the main area, and
the separating portion includes:
a separating-body region of the second conductivity type that is disposed in the first semiconductor layer, is apart from the sensing-body region, is in contact with a surface of the first semiconductor layer, and is electrically connected with the source electrode; and
a fourth region of the first conductivity type that is part of the first semiconductor layer and is between the separating-body region and the sensing-body region.
3. The semiconductor device according to claim 2, wherein
the separating portion further includes a separation assisting layer of the first conductivity type that is disposed on the first semiconductor layer, and is in contact with the fourth region, a concentration of an impurity of the first conductivity type in the separation assisting layer is higher than a concentration of an impurity of the first conductivity type in the drift region, and the separation assisting layer is electrically separated from the temperature-sensing conductive layer.

4. The semiconductor device according to claim 2, wherein a concentration of an impurity of the first conductivity type in the fourth region is higher than a concentration of an impurity of the first conductivity type in the drift region.

5. The semiconductor device according to claim 1, wherein a concentration of an impurity of the first conductivity type in the temperature-sensing conductive layer ranges from $1 \times 10^{17}$ cm$^{-3}$ to $1 \times 10^{19}$ cm$^{-3}$ inclusive.

6. The semiconductor device according to claim 1, wherein the temperature-sensing conductive layer has a shape like an island.

7. The semiconductor device according to claim 1, wherein when the first region is seen in a direction perpendicular to the main side of the semiconductor substrate, the first region is disposed in such a manner that the first region surrounds the second region, and the third region is disposed between the first region and the second region.

8. The semiconductor device according to claim 1, wherein each of the plurality of unit cells further includes a channel layer of the first conductivity type, and the channel layer is disposed between the first semiconductor layer and the gate insulating film in such a manner that the channel layer is in contact with at least the main-body region, and a concentration of an impurity of the first conductivity type in the channel layer is higher than a concentration of an impurity of the first conductivity type in the drift region.

9. The semiconductor device according to claim 1, wherein the temperature sensor further includes a sensing-body contact region of the second conductivity type that is in the sensing-body region, and a concentration of an impurity of the second conductivity type in the sensing-body contact region is higher than a concentration of an impurity of the second conductivity type in the sensing-body region, and the sensing-body contact region is in contact with the first electrode.

10. The semiconductor device according to claim 1, wherein the main-body region and the sensing-body region have an equal concentration profile of an impurity of the second conductivity type in depth directions of the main-body region and the sensing-body region.

11. The semiconductor device according to claim 1, wherein the first semiconductor layer is a silicon carbide semiconductor layer.

* * * * *